United States Patent
Kojima et al.

(10) Patent No.: US 7,403,447 B2
(45) Date of Patent: Jul. 22, 2008

(54) METHOD FOR STABILIZING ELECTRONIC CIRCUIT OPERATION AND ELECTRONIC APPARATUS USING THE SAME

(75) Inventors: Hiroyuki Kojima, Kawasaki (JP); Tomohiro Tanaka, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 206 days.

(21) Appl. No.: 11/237,659

(22) Filed: Sep. 29, 2005

(65) Prior Publication Data

US 2006/0018058 A1 Jan. 26, 2006

Related U.S. Application Data

(63) Continuation of application No. PCT/JP03/05968, filed on May 14, 2003.

(51) Int. Cl.
*G11C 8/00* (2006.01)

(52) U.S. Cl. .............. 365/233.1; 365/230.01; 327/141

(58) Field of Classification Search .............. 365/233.1, 365/230.01, 233; 327/141
See application file for complete search history.

(56) References Cited

U.S. PATENT DOCUMENTS

| 6,433,607 | B2 * | 8/2002 | Kawasaki et al. | 327/299 |
| 6,963,518 | B2 * | 11/2005 | Sasaki et al. | 365/236 |
| 2002/0039316 | A1 | 4/2002 | Tobita | |

FOREIGN PATENT DOCUMENTS

| JP | 05-290187 | 11/1993 |
| JP | 06-028053 | 2/1994 |
| JP | 07-154240 | 6/1995 |
| JP | 07-264775 | 10/1995 |
| JP | 09-138719 | 5/1997 |
| JP | 11-074466 | 3/1999 |
| JP | 2000-354364 | 12/2000 |
| JP | 2002-202961 | 7/2001 |
| JP | 2001-345698 | 12/2001 |
| JP | 2002-015580 | 1/2002 |
| JP | 2002-117670 | 4/2002 |
| JP | 2003-036676 | 2/2003 |
| JP | 2003-046905 | 2/2003 |

OTHER PUBLICATIONS

International Search Report dated Jun. 24, 2003 in corresponding PCT Patent Application No. PCT/JP2003/005968 (Japanese and English translation).

* cited by examiner

*Primary Examiner*—Richard T. Elms
*Assistant Examiner*—Nam Nguyen
(74) *Attorney, Agent, or Firm*—Staas & Halsey LLP

(57) ABSTRACT

An operation signal generator circuits are provided to continue to operate an object circuit which is not operated unless an operation signal arrives for the purpose of power consumption reduction, and thereby the object circuit is put into dummy operation. This enables an influence of environmental factors, which may affect operation of the circuit element included in the object circuit, to be maintained in a stable or balanced state, and also enables stable and accurate operation of the object circuit at the time of actual operation, with reduced power consumption.

20 Claims, 18 Drawing Sheets

METHOD FOR STABILIZING ELECTRONIC CIRCUIT OPERATION AND ELECTRONIC APPARATUS USING THE SAME

CROSS-REFERENCE TO RELATED APPLICATIONS

This application is a continuation of international application PCT/JP2003/005968, filed on May 14, 2003.

FIELD OF THE INVENTION

The present invention relates to a method for stabilizing operation of an electronic circuit, and an electronic apparatus using the same, capable of reducing fluctuation of delay time in a circuit element depending on operational environments of an integrated circuit, and more particularly, a method for stabilizing operation of an electronic circuit, and an electronic apparatus using the same, capable of reducing fluctuation of delay time in a circuit element of an integrated circuit which is operated in a low power consumption mode.

BACKGROUND ARTS

In regard to an electronic circuit such as a large-scale processor performing high-speed processing, the degree of integration has been increased on the one hand, while low power consumption is required on the other, by which LSI design comes to be restricted. Namely, in the electronic circuit of this kind, it is required to satisfy both high frequency and low power consumption.

To realize such low power consumption, in a CPU and a DRAM which require clock, etc. continuously, an operating method with a reduced clock frequency has been introduced, with the provision of a standby mode (For example, refer to Japanese Patent Laid open Publication No. Hei 5-290187 and No. Hei 6-028053). Also, in the logic design technology, efforts have been made to reduce power consumption in an overall LSI, by controlling to securely inhibit the operation, except for when the operation is necessary, with clock supply to the object circuit being suspended (For example, refer to Japanese Patent Laid open Publication No. Hei-11-074466).

The integrated circuit concerned has a variety of circuit elements including diodes, transistors, resistors and capacitors integrated therein. In each individual circuit element, there is fluctuation in the operation thereof, particularly in delay time, caused by fluctuated peripheral environments such as temperature, supply voltage and noise, and fluctuation incurred when manufacturing the circuit element concerned.

Accordingly, when designing an integrated circuit such as processor, usually, considering the fluctuation in the delay time in the circuit elements, marginal design has been adopted to guarantee against the delay time, by assigning the margin using the cases of the operation speed being the highest and the lowest.

In the situation of today, in which higher frequency and lower power consumption are required more and more, peripheral environments of the circuit elements, and previous operation conditions as well, may relatively influence more severely. Therefore, a more accurate marginal value is required for guaranteeing against delay time.

Meanwhile, to guarantee against the delay time, because a wide fluctuation range between the highest and lowest operation speeds of the circuit element is to be taken into account when assigning the margin, it is probable that an excessive margin is assigned for guaranteeing in consideration of the worst case.

As high-speed operation is increasingly required, a severer marginal value is required. However, adoption of new semiconductor technology includes phenomena which are not completely solved. This brings about difficulty in obtaining an accurate margin, and sometimes the margin may fall short. Under such a circumstance, unexpected events may occur, and accurate operation may be impeded.

For example, in the design technology, there has been introduced a trial to realize low power consumption by suspending clock supply to an object circuit except for the time of necessary operation. This causes a state that the transistor, etc. included in the object circuit are not in operation for a long time.

When the transistor is operated, the transistor consumes power, generates heat, produces a varied temperature, or a varied impedance of the transistor, by which an instantaneous variation/reduction (A.C./D.C.-Drop) of the supply voltage is produced. With this, a variety of parameters, such as threshold voltage (Vth), ON current (Ids-ON), OFF current (Ids-OFF), wiring resistance, delay time, are varied.

Thus, when the transistor becomes operated, the peripheral environments, such as the temperature and the supply voltage, become different from those when the transistor is not operated. When a circuit element such as transistor becomes operated after the transistor has not been in operation for a long time, the characteristic of the circuit element varies, and the operation becomes either faster or slower, as compared to the case when the transistor has been in operation continuously. In other words, a larger margin becomes necessary for guaranteeing the operation, and in the actual operation, accurate operation may be impeded.

Further, in the semiconductor technology, an SOI (silicon-on-insulator) has been adopted as an option for satisfying low power consumption. Here, one of the known problems in the SOI is a history effect.

FIG. 22 shows a configuration diagram of a bulk substrate, while FIG. 23 shows a configuration diagram of an SOI substrate. As shown in FIG. 22, in regard to a transistor using the bulk substrate, a drain 101 and a source 102 are disposed in a Si substrate 100, and also a gate 103 is disposed through an insulator (SIO2) 104. Thus the transistor is structured.

Meanwhile, as shown in FIG. 23, as to a transistor using the SOI substrate, a drain 101 and a source 102 are disposed on an insulator (SiO2) 110 being provided on a Si substrate 100, and also a gate 103 is disposed through an insulator (SiO2) 104. Thus, the transistor is structured.

Accordingly, since the transistor is surrounded by the insulator, current leakage caused by a capacitive component can be avoided, thus enabling reduction of the power consumption. Meanwhile, with this, body potential of a body 105 disposed between drain 101 and source 102 becomes in a floating state, which is not electrically fixed. As a result, the body potential fluctuates depending on the previous operational and bias conditions.

Also, since a transistor threshold voltage Vth is influenced by the body potential, the switching operation of the transistor becomes either faster or slower, depending on the previous operational and bias conditions. As factors causing fluctuation of the body potential, there are a short-term factor produced when the transistor is operated and a long-term factor produced when the transistor is not operated.

When the transistor is operated, the body potential is abruptly varied caused by the coupling capacitance thereof. When the transistor is not in operation for a long time, a voltage is applied between two terminals (among gate 103, drain 101 and source 102). This produces an electric field in the vicinity of body 105, causing a gradual variation of the body potential.

The body potential is determined by complicated operation histories in the past, being combined with both short-term and long-term factors. Therefore, it is considered to have a variety of values. Caused by this, the switching operation becomes slow or fast when the transistor becomes operated actually. Namely, similar to the aforementioned case, larger margin becomes required for the operational guarantee, and a case of the accurate operation being impeded may arise in the actual operation.

As such, in the situation that a high frequency and low power consumption are required, and that influences to the circuit elements caused by the peripheral environments and previous operational conditions become relatively critical, it is desired to have a means for reducing or eliminating fluctuation of the delay time produced in the circuit element operation.

SUMMARY OF THE INVENTION

Accordingly, it is an object of the present invention to provide a method for stabilizing the operation of an electronic circuit, and an electronic apparatus using the same, for performing high-frequency operation by reducing the margin for guaranteeing the electronic circuit operation, which is operated only at the time of receiving an operation signal for the purpose of power saving.

Further, it is an object of the present invention to provide a method for stabilizing the operation of an electronic circuit, and to provide an electronic apparatus using the same, for obtaining both power saving and high-frequency driving simultaneously, by forcibly operating the electronic circuit which has not been operated for a long time, and reducing the margin for guaranteeing the electronic circuit operation.

Still further, it is an object of the present invention to provide an operation stabilization method of an electronic circuit, and an electronic apparatus using the same, for reducing fluctuation of the delay time in the operation of the electronic circuit having a power saving structure.

In order to achieve the aforementioned objects, according to the present invention, a method for stabilizing the operation of an electronic circuit, which operates a circuit element group in the electronic circuit by an external operation signal, includes the steps of: generating an operation signal periodically from a pulse generator unit, so as to forcibly operate the circuit element group; and outputting the external operation signal and the periodic operation signal to the circuit element group.

Also, according to the present invention, an electronic circuit includes: an electronic circuit operating a circuit element group by an external operation signal; a pulse generator unit periodically generating an operation signal to forcibly operate the circuit element group; and a logic circuit synthesizing the external operation signal with the periodic operation signal, and outputting the synthesized signal to the circuit element group.

According to the present invention, by equipping the pulse generator circuit for periodically operating an object circuit element group which is not operated unless an operation signal arrives, it becomes possible to maintain in a stable state or in a balanced state an influence of environmental factors which may affect operation of the circuit element included in the object electronic circuit. Thus, it becomes possible to obtain stable and accurate operation of the object electronic circuit at the time of actual operation. With this, in the situation such that the influences of the peripheral environments to the circuit element are becoming relatively increased to satisfy severer requirements, and that an unexpected situation may possibly occur due to the adoption of new technology, to aim at ensuring continuous safety, the above-mentioned factors which may influence the operation can be eliminated with the provision of a simple circuit.

According to the present invention, preferably, the operation signal is a clock for operating the circuit element group. With this, the object electronic circuit can forcibly be operated with the provision of a simple circuit, and the operation can be performed stably and securely at the time of ordinary operation.

Further, according to the present invention, preferably, the operation signal is an input pattern for operating the circuit element group. With this, the object electronic circuit can forcibly be operated with a variety of patterns with the provision of a simple circuit, and the operation can be performed stably and securely at the time of ordinary operation.

Still further, according to the present invention, preferably, the method further includes the step of outputting an input pattern, synchronously with the operation signal, to forcibly operate the circuit element group to the circuit element group. With such an operation signal and an input pattern, the electronic circuit group can forcibly be operated with an extended operational range, and the operation can be performed more stably and securely at the time of ordinary operation.

Further, according to the present invention, preferably, the method further includes the step of arbitrating between the external input pattern and the input pattern for the forcible operation, and prioritizing the external input pattern. With this, even when the forcible operation is performed, impediment against the ordinary operation can be avoided, because the input pattern for the ordinary operation is prioritized.

Further, according to the present invention, preferably, the method further includes the step of shifting the timing of the generated operation signal, and outputting to a circuit element group in another electronic circuit. With this, forcible operation of a plurality of electronic circuits can be performed on a time sharing basis, using a single forcible operation signal generator circuit, which contributes to the power saving.

Further, according to the present invention, preferably, the circuit element group in the electronic circuit is constituted of an SRAM, and the operation signal is a clock for the SRAM. Thus, the power saving SRAM which is not operated without a clock input is forcibly operated, and thereby, ordinary operation of the SRAM is guaranteed stably and securely.

Further, according to the present invention, preferably, the circuit element group in the electronic circuit is constituted of an SRAM, and the operation signal is a clock for the SRAM, and the input pattern is a memory address of the SRAM. With this, a necessary portion of the SRAM can be operated forcibly, and thereby, ordinary operation of the SRAM is guaranteed stably and securely.

Further, according to the present invention, preferably, the step of generating the operation signal is executed at the time of reading the SRAM. Because of the read operation, the SRAM data are not influenced even when the forcible operation is performed, by treating the output as being invalid.

Still further, according to the present invention, preferably, the circuit element group in the electronic circuit is constituted of a dynamic circuit; and the input pattern enables the dynamic circuit to perform logic operation. With this, by forcibly operating a high-speed dynamic circuit, it becomes possible to guarantee high-speed operation of the dynamic circuit at the time of the ordinary operation.

PREFERRED EMBODIMENTS OF THE INVENTION

The preferred embodiments of the present invention are described hereinafter, in order of first embodiment, second embodiment, third embodiment, fourth embodiment, fifth embodiment, and other embodiments.

The First Embodiment

Figure 1:
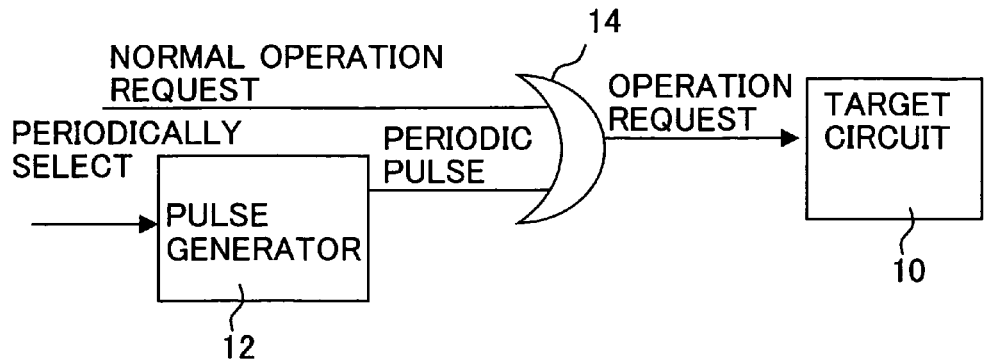
FIG. 1 shows a configuration diagram according to a first embodiment of the present invention.
Figure 2:
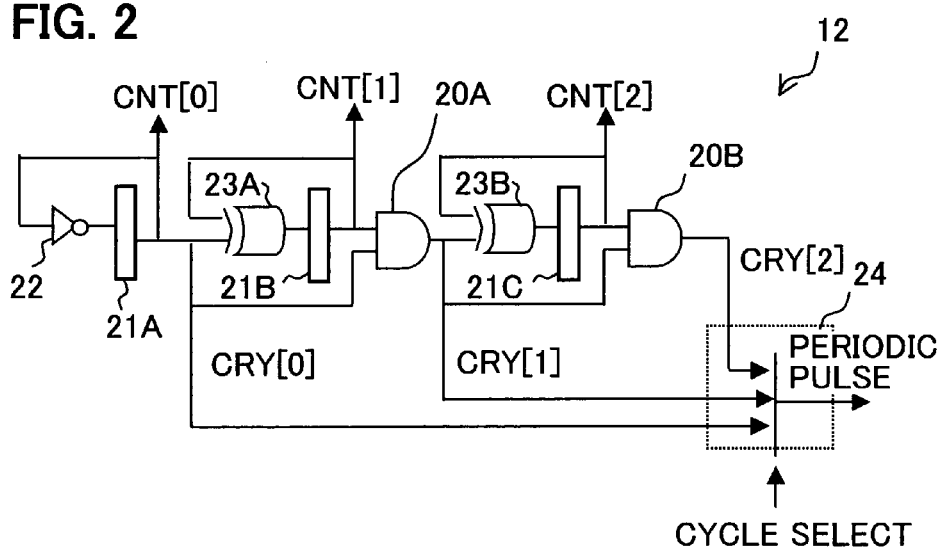
FIG. 2 shows a configuration diagram of a pulse generator circuit shown in FIG. 1.
Figure 3:
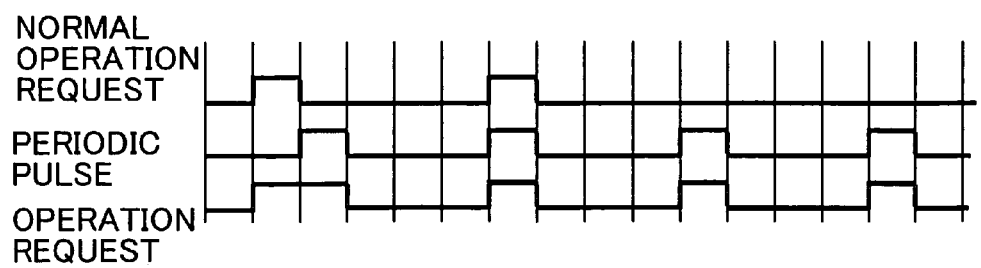
FIG. 3 shows an operational time chart of the configuration shown in FIG. 1.
Figure 4:
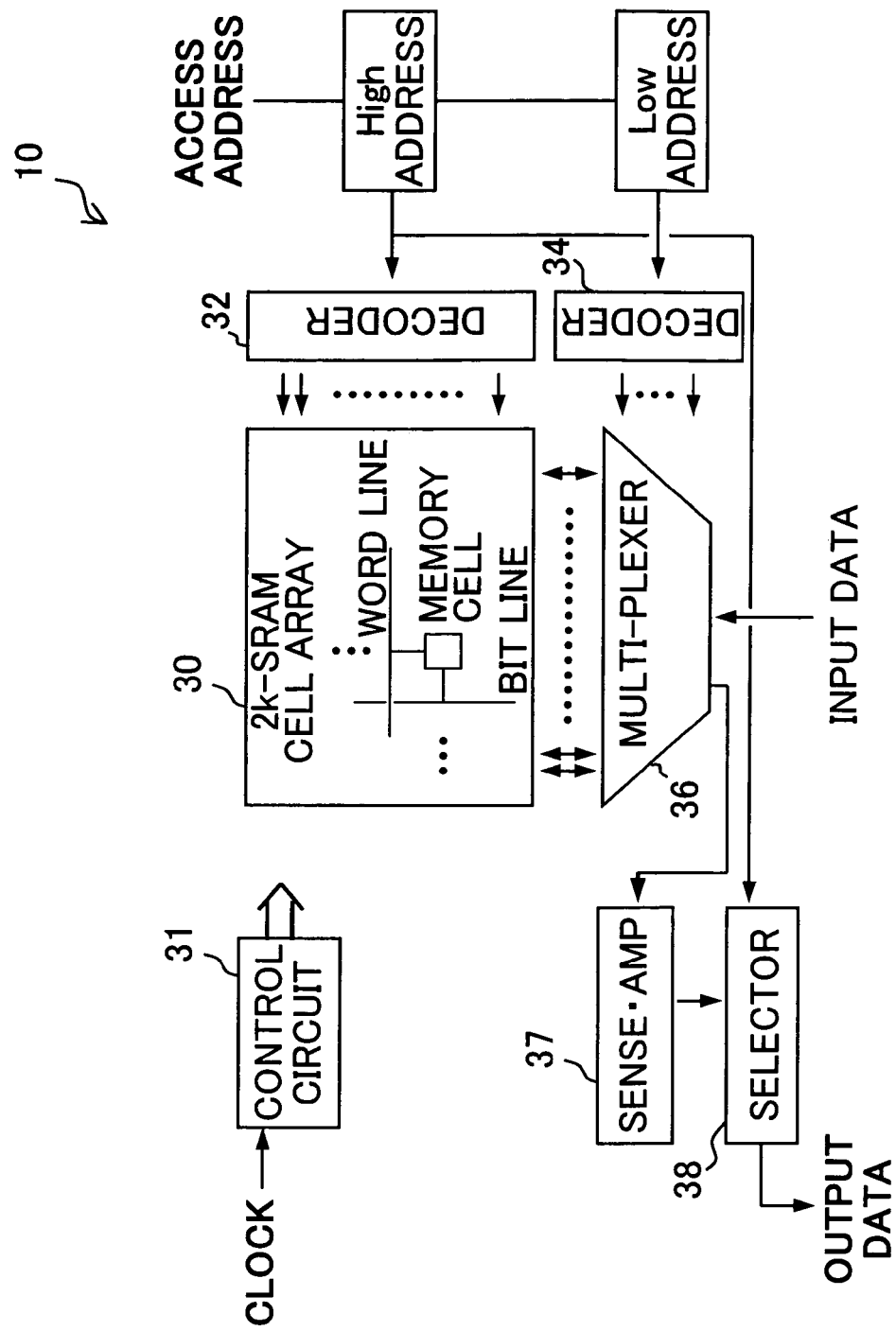
FIG. 4 shows a configuration diagram of an SRAM as an example of the object circuit shown in FIG. 1.

FIG. 1 shows a configuration diagram according to a first embodiment of the present invention; FIG. 2 shows a configuration diagram of a pulse generator circuit thereof; FIG. 3 shows an operational time chart of FIG. 1; and FIG. 4 shows a configuration diagram as an example of the object circuit shown in FIG. 1.

As shown in FIG. 1, an object circuit 10 is an electronic circuit which is operated only when receiving an operation request, and for example, an SRAM (static random access memory) described later in FIG. 4. A pulse (operation request) generator unit 12 periodically generates periodic pulses for operating the object circuit 10. An OR circuit 14 performs OR between an ordinary-system operation request (i.e., a normal operation request) from a processor, etc. and a periodic pulse from the pulse generator unit 12, and outputs an operation request to the object i.e., (target) circuit 10.

The object circuit 10 is operated on receipt of the ordinary-system operation request, while it is not operated when no ordinary-system operation request is received. Therefore, by providing the pulse generator unit 12, periodically outputting the operation requests to the object circuit 10 as shown in FIG. 3, forcible dummy operation is performed in the object circuit 10. Thus, an influence caused by environmental factors which affect the operation of the circuit elements included in the object circuit 10 is retained in a state of being stabilized or balanced (with a reduced fluctuation width).

With this, it becomes possible to perform stable and accurate operation when the object circuit is operated (when the ordinary-system operation request is received). The periodic operation period may be variable, so as to be set to the value by which an actual problem is solved.

This pulse generator unit 12 is realized using, for example, a counter, as shown in FIG. 2. The counter shown in FIG. 2 is constituted of a 3-bit counter, which counts from b000 to b111 (CNT[2:0]). At this time, a carry (CRY[2:0]) generated from each bit is used for the periodic pulse.

Namely, the first bit is constituted of an inverting circuit 22 and a latch circuit 21A, and generates CNT[0], which repeats '0' and '1'. The second bit is constituted of an E-OR circuit 23A, a latch circuit 21B, and an AND gate 20A. The second bit repeats '0' and '1' by means of a carry output CRY[0] of the first bit, and generates a carry output CRY[1] from the AND gate 20A. The third bit is constituted of an E-OR circuit 23B, a latch circuit 21C, and an AND gate 20B. The third bit repeats '0' and '1' by means of a carry output CRY[1] of the second bit, and generates a carry output CRY[2] from the AND gate 20B.

A selector circuit 24 enables the period of the periodic pulses to be variable, by selecting either of the carry outputs from the respective bits, using a period selection signal.

Next, the object circuit 10 will be described referring to FIG. 4. When using the SRAM in a large-scale and high-speed processor, since low power consumption is required, the circuit is configured so that a clock is suspended when the SRAM operation is not necessary. With this, when the SRAM is actually read out after the state of no clock being applied to the SRAM continues for a long time, the internal circuits of the SRAM, namely bit lines, word lines, column selector, sense amplifier, and in particular the circuits in the clock distribution system are influenced, and as a result, actual readout may not be performed accurately in some cases.

To cope with this, the counter (pulse generator) 12 for periodically issuing SRAM operation requests as shown in FIGS. 1 and 3 is provided outside the SRAM, and clocks are forcibly applied at constant intervals, even when no clock has been applied because of no use of the SRAM for a long time.

Namely, the operation request shown in FIG. 1 is a clock shown in FIG. 4. A memory control circuit 31 controls SRAM cell array 30, decoders 32 and 34, multiplexer 36, sense amplifier 37 and selector 38, by use of the clock. A word line of the cell array 30 is selected using an upper-level address of an access address, while a bit line of the cell array 30 is selected using a lower-level address of the access address.

As to readout, a data is read out from the cell array 30 which is selected by the multiplexer 36, and is output via the sense amplifier 37 and the selector 38. As to write, an input data is written on a memory cell of the bit line which is selected by the multiplexer 36.

In the example shown in FIG. 1, only the clock is supplied periodically. Since the address is fixed, at the time of reading, the control circuit 31, the bit line of the cell array 30, and the sense amplifier 37 are operated by clock. With such a configuration, it becomes possible to eliminate factors which may influence the delay time in the circuit element operation operated by the clock. Also, it becomes possible to fetch accurate data when readout from SRAM is actually required (i.e. when an ordinary-system operation request occurs).

Further, the period of issuing the operate request pulse shown in FIG. 3 is constituted of the carry bits in the counter, and can be set variably, depending on which carry bit is selected. The period may be set, through experience, etc., to a value which can finally solve the problem.

As such, by equipping a simple circuit, stable and secure operation may be achieved, suppressing fluctuation of the delay time in the operation which is caused by the influences such as peripheral environments of the circuit element. Therefore, the method is effective for obtaining high speed and low power consumption in future, particularly when producing a processor chip, etc.

The Second Embodiment

Figure 5:
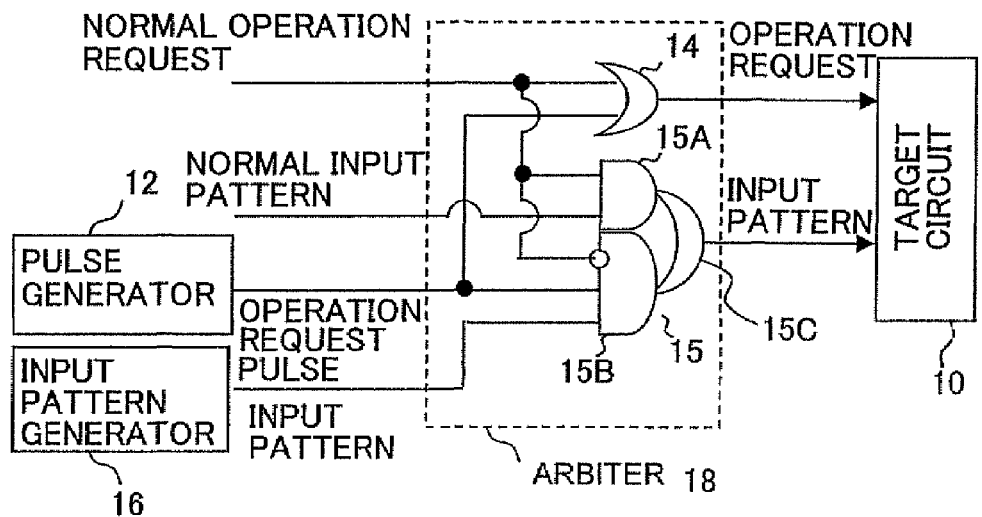
FIG. 5 shows a configuration diagram according to a second embodiment of the present invention.
Figure 6:
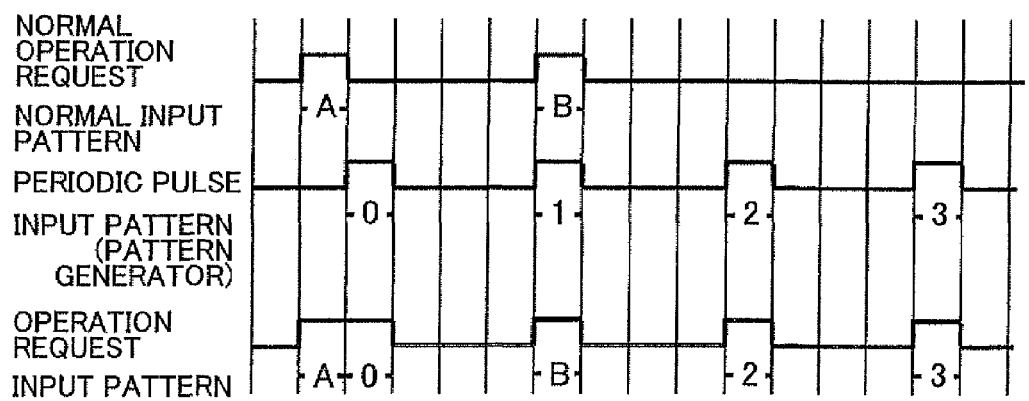
FIG. 6 shows an operational time chart of the configuration shown in FIG. 5.
Figure 7:
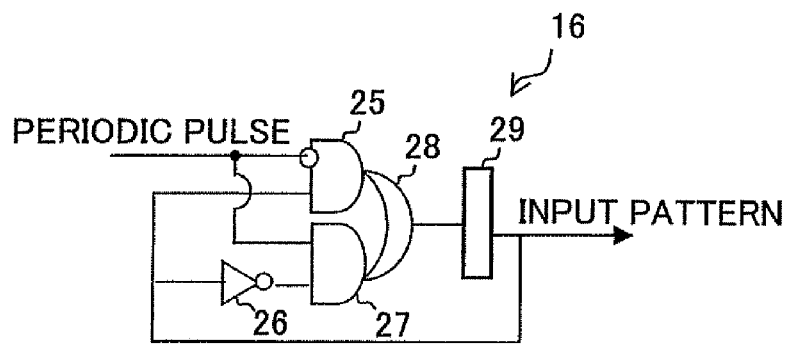
FIG. 7 shows a configuration diagram of the input pattern generator circuit shown in FIG. 5.
Figure 8:
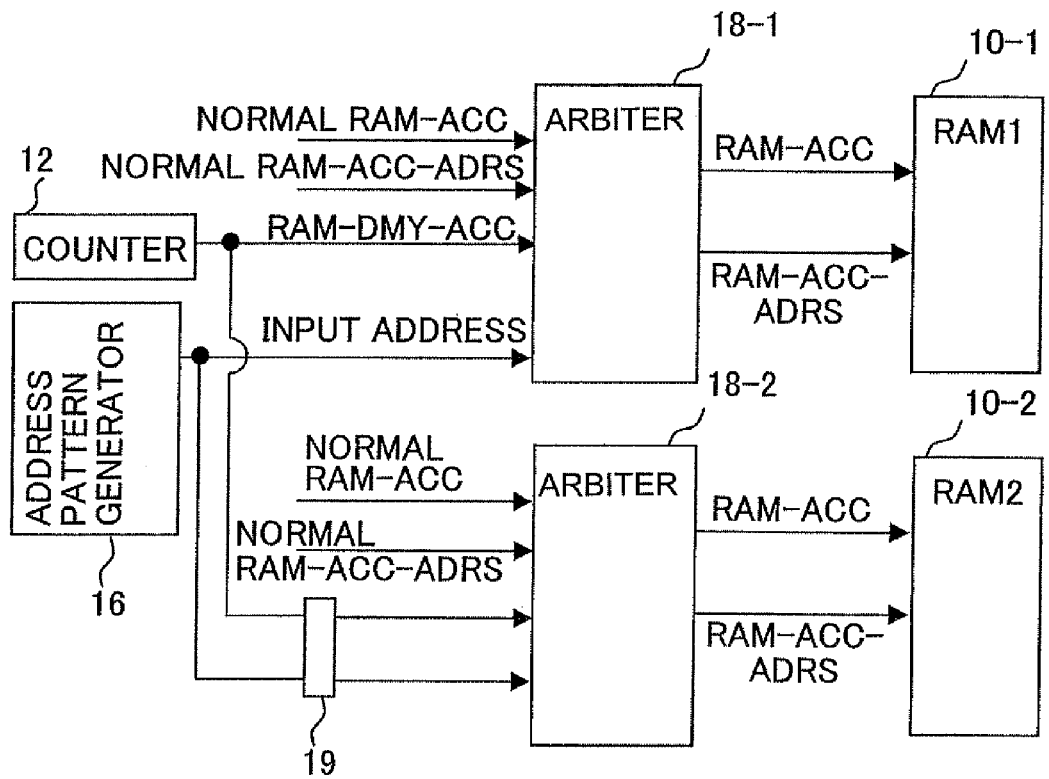
FIG. 8 shows a configuration diagram of an SRAM system as an application example of the configuration shown in FIG. 5.

FIG. 5 shows a configuration diagram according to a second embodiment of the present invention; FIG. 6 shows a time chart of FIG. 5; FIG. 7 shows a configuration diagram of an input pattern generator circuit thereof; and FIG. 8 shows a configuration diagram as an application example of FIG. 5 to a memory system.

In FIG. 5, like parts shown in FIG. 1 are referred to by like symbols. A pattern generator circuit 16 is added to the configuration of the first embodiment, and a fixed or variable pattern is input to the object (i.e., target) circuit 10 when the object circuit 10 is periodically operated. With this, it becomes possible to save a necessary portion of the object circuit 10. Further, an arbiter circuit 18 is provided against a conflict between the periodic operation and the ordinary operation in the object circuit 10, so as to suspend the periodic operation during the ordinary operation and thereby avoiding any influence to the ordinary system.

Namely, as shown in FIG. 6, the relation between the operation request signal and the object circuit 10 is the same as that in the case of the embodiment shown in FIG. 1. When the operation portion in the object circuit 10 is different depending on an input pattern, or when there exists a portion in which an internal state of the object circuit 10 does not change (no switching operation) by the input pattern, an appropriate input pattern is supplied in addition to the operation request being supplied to the object circuit 10. With this, it becomes possible to obtain variation (switching operation) throughout the object circuit 10.

The pattern generator unit 16 generates an appropriate pattern when a periodic pulse is generated by the pulse generator unit 12, namely when operation of the object circuit is requested, and uses the generated pattern as an input pattern to the object circuit 10. As shown in FIG. 7, the pattern generator unit 16 generates either fixed or different patterns. Basically, in order that a valid input pattern is obtained at the time of generating the periodic pulse, the pattern generator unit 16 receives a periodic pulse from the pulse generator unit 12, and generates a next input pattern, using this periodic pulse as trigger.

The pattern generator unit 16 shown in FIG. 7 is an exemplary circuit for generating different patterns at the time of generating periodic pulses. Except for the time the periodic pulse is generated, a previous input pattern latched by a latch circuit 29 through an AND gate 25 and an OR gate 28 continues to be selected. On the other hand, when the periodic pulse is generated, an input pattern inverted by an inverting circuit 26 and passing through an AND gate 27 and the OR gate 28 is output to the latch circuit 29, as a next input pattern.

Referring back to FIG. 5, the arbiter circuit 18 is constituted of an OR circuit 14 and a pattern arbiter circuit 15. The arbiter circuit 15 arbitrates so that the input pattern from the pattern generator unit 16 does not influence the ordinary system operation. Namely, as shown in FIG. 5, when the operation request in the ordinary system is valid, an input pattern of the ordinary system is selected by means of an AND gate 15A and an OR gate 15C.

On the other hand, when the operation request in the ordinary system is invalid, an input pattern generated by the pattern generator unit 16 is selected synchronously with the operation request pulse from the pulse generator circuit 12, by means of an AND gate 15B and OR gate 15C. The period of these periodic pulses is set to an appropriate value by means of a period selection signal.

FIG. 8 shows an application example in which the object circuit 10 shown in FIG. 5 is constituted of two SRAMs 10-1, 10-2. As shown in FIG. 8, in addition to SRAMs 10-1, 10-2, a counter (pulse generator) 12 is provided for the purpose of periodically issuing RAM operation requests. Thus, even a clock RAM-ACC is not applied because RAMs 10-1, 10-2 are not used for a long time, a clock RAM-DMY-ACC is forcibly applied at periodic intervals. By this, it becomes possible to eliminate factors which may influence the delay time in the operation of the circuit element, and to fetch accurate data when readout from RAM is actually required.

Also, depending on the configurations of RAMs 10-1, 10-2, there may be a case that the operating points in the RAM differ depending on the input addresses. Accordingly, an address pattern generator circuit 16 is provided so as to vary the access addresses of RAMs 10-1, 10-2, when periodically operating RAMs 10-1, 10-2. With this, overall circuit elements inside the RAM are acted evenly.

Further, since RAM operation request pulses are supplied periodically, a conflict may be produced against readout operation from RAM which is actually necessary. To avoid this, arbiter circuits 18-1, 18-2 are provided in the circuit configuration, so that a RAM operation request sent from the counter 12 is not processed when the ordinary operation is requested. With this, the ordinary operation is not influenced.

Additionally, a latch circuit 19 is provided to forcibly operate RAMs 10-1, 10-2 periodically on a time division basis. The latch circuit 19 latches and delays both the operation request pulse from the counter 12 and the input address from the address pattern generator circuit 16, and inputs to the arbiter circuit 18-2.

As such, the circuit element characteristic of an integrated circuit varies with the peripheral environments. As major peripheral environment factors, there are a supply voltage at the circuit element ends, and a temperature. Ideally, the supply voltage and the temperature as peripheral environments are to be stable at all times, but they actually vary greatly, caused by the operation of the circuit element.

In the state the circuit element has not been operated for a long time, the supply voltage is close to a VDD to the maximum extent, and stable, and also the temperature is close to the external air temperature to the maximum extent, and stable. On the other hand, in the state the circuit element is continuously in operation, the supply voltage is lower than the VDD, and continuously varies. Also, the temperature is substantially higher than the external air temperature (in the vicinity of 100° C.), and continuously varies.

Since the differences between these two states are large, a large margin is required to guarantee the operation. Therefore, according to the present invention, by continuously operating the circuit element periodically, a state of the circuit element being not in operation for a long time is no more existent. Thus, it becomes sufficient if the operation guarantee is considered for the state such the circuit element is kept in periodic operation, and the circuit element is in continuous operation. Thus, the margin can be reduced.

Also, in the case the SOI technology is adopted, if a state of a transistor being not in operation exists for a long time, the past operation history becomes complicated, and an obtainable body potential becomes wide in range. As a result, the switching speed of the transistor largely fluctuates, and a large margin becomes necessary to guarantee the operation thereof.

Therefore, according to the present invention, by periodically operating the circuit element, a state of no operation continuing for a long time is no more existent, and the operation history of the transistor is substantially the same at any timing. Thus, the fluctuation range of the body potential of the transistor becomes smaller, and the fluctuation of the switching speed also becomes smaller. In other words, the margin can be reduced.

As such, by providing a simple circuit, it becomes possible to refrain the fluctuation of the delay time in the operation influenced by the peripheral environments, etc. of the circuit element, and to obtain stable and secure operation. This is effective when producing a processor chip, etc. to obtain high-speed operation and low power consumption.

Further, depending on the RAM configuration, there may be a case that the operating points in the RAM differ depending on the input addresses. Therefore, by providing an address pattern generator circuit so as to disperse RAM access addresses when periodically operating the RAM, overall circuit elements inside the RAM are acted evenly. Thus, more stable and secure operation can be attained.

Further, since RAM operation request pulses are supplied periodically, a conflict may be produced against readout operation from RAM which is actually necessary. To avoid this, using an arbiter circuit, a RAM operation request sent from the counter 12 is not processed when the ordinary operation is requested. With this, the ordinary operation is not influenced.

The Third Embodiment

Figure 9:
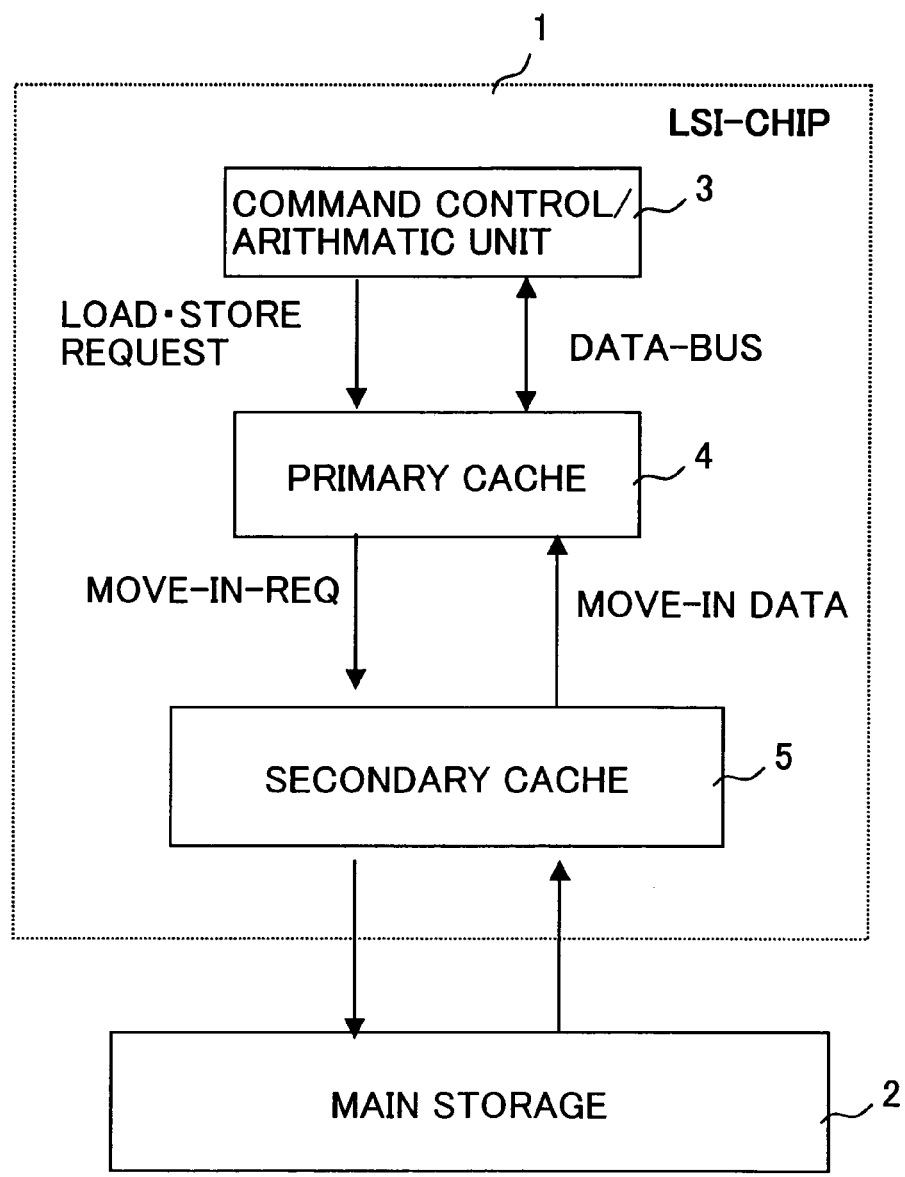
FIG. 9 shows a configuration diagram of a processor according to a third embodiment of the present invention.
Figure 10:
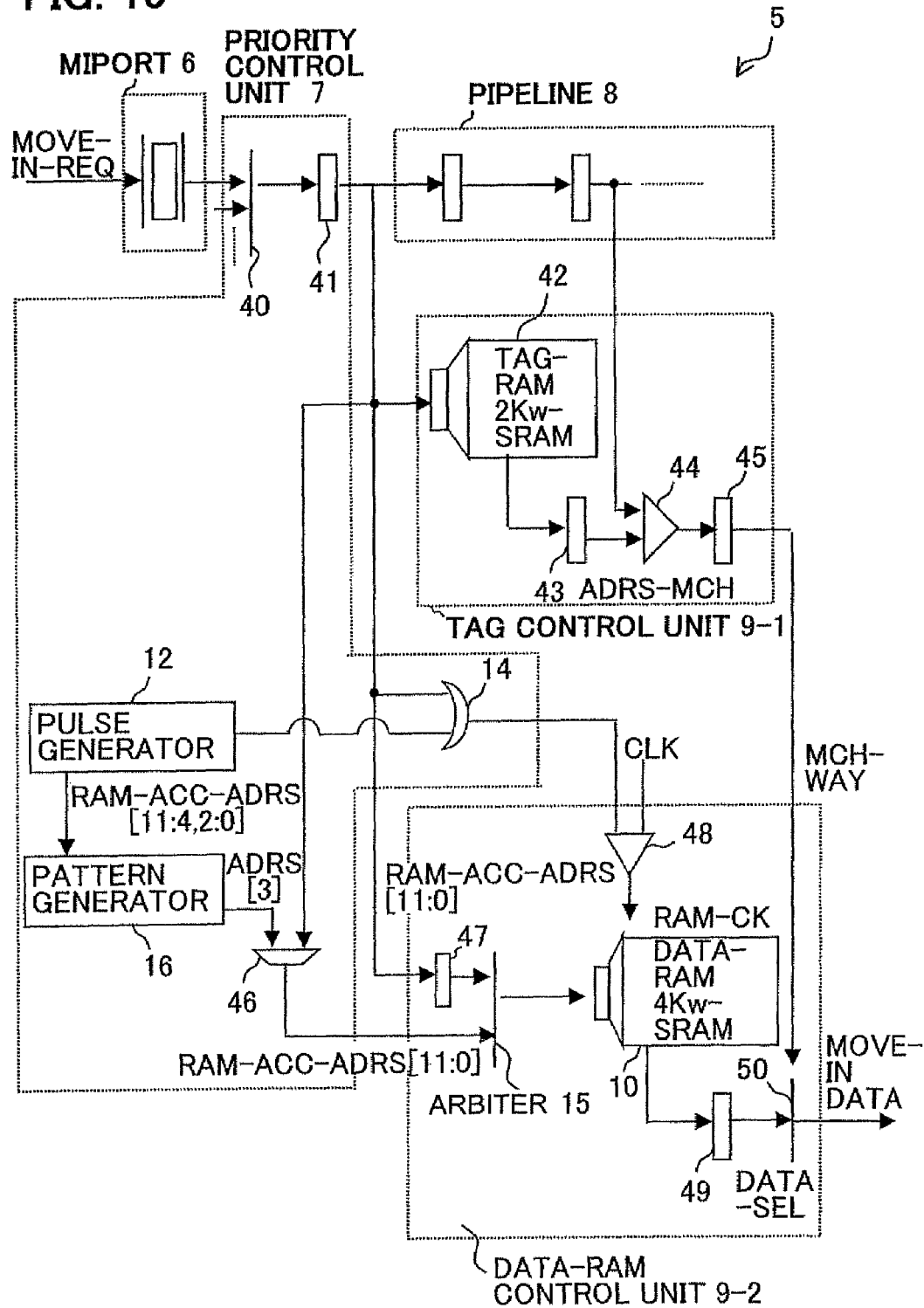
FIG. 10 shows a configuration diagram of a secondary cache shown in FIG. 9.
Figure 11:
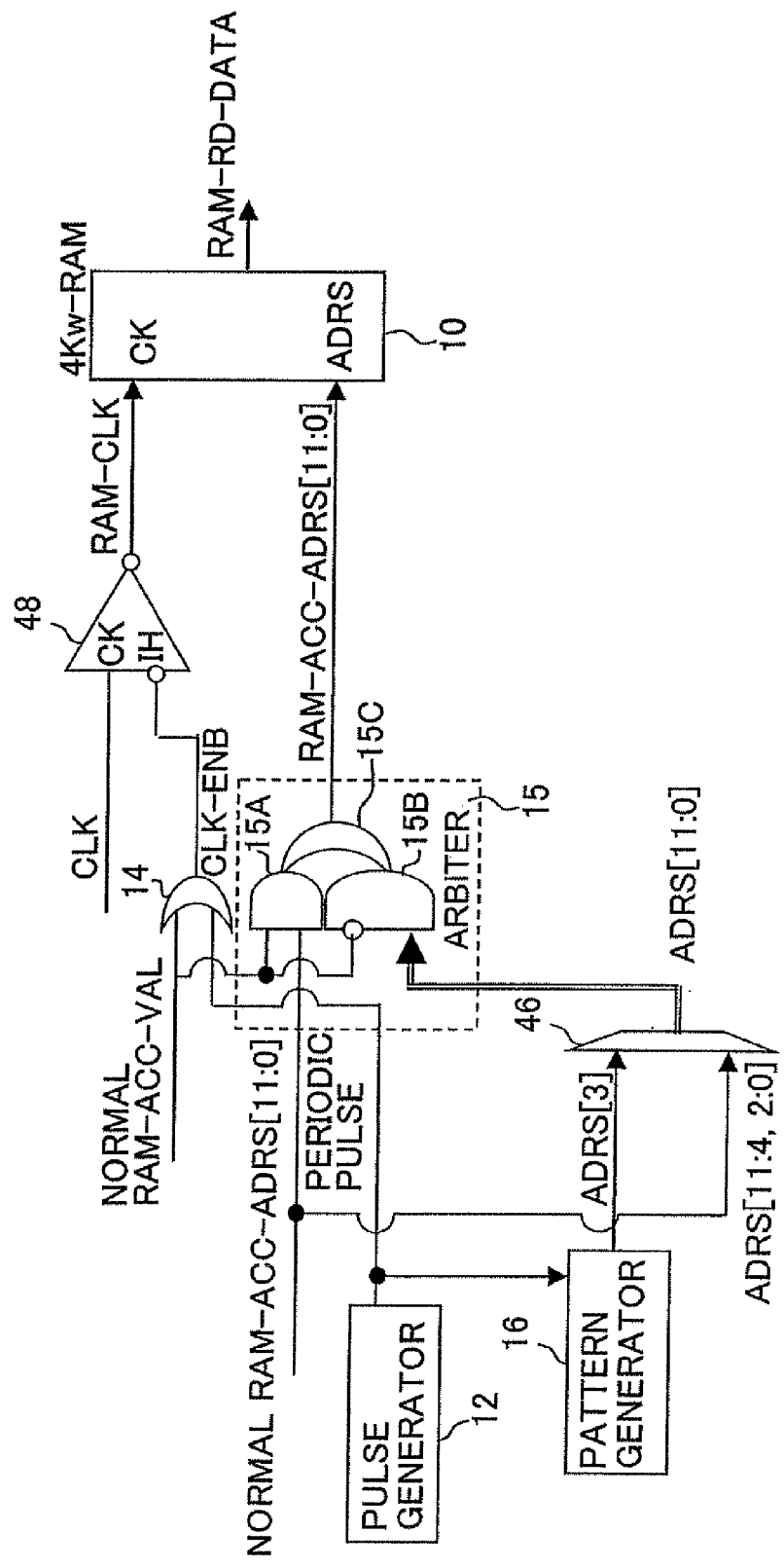
FIG. 11 shows a detailed partial diagram of FIG. 10.
Figure 12:
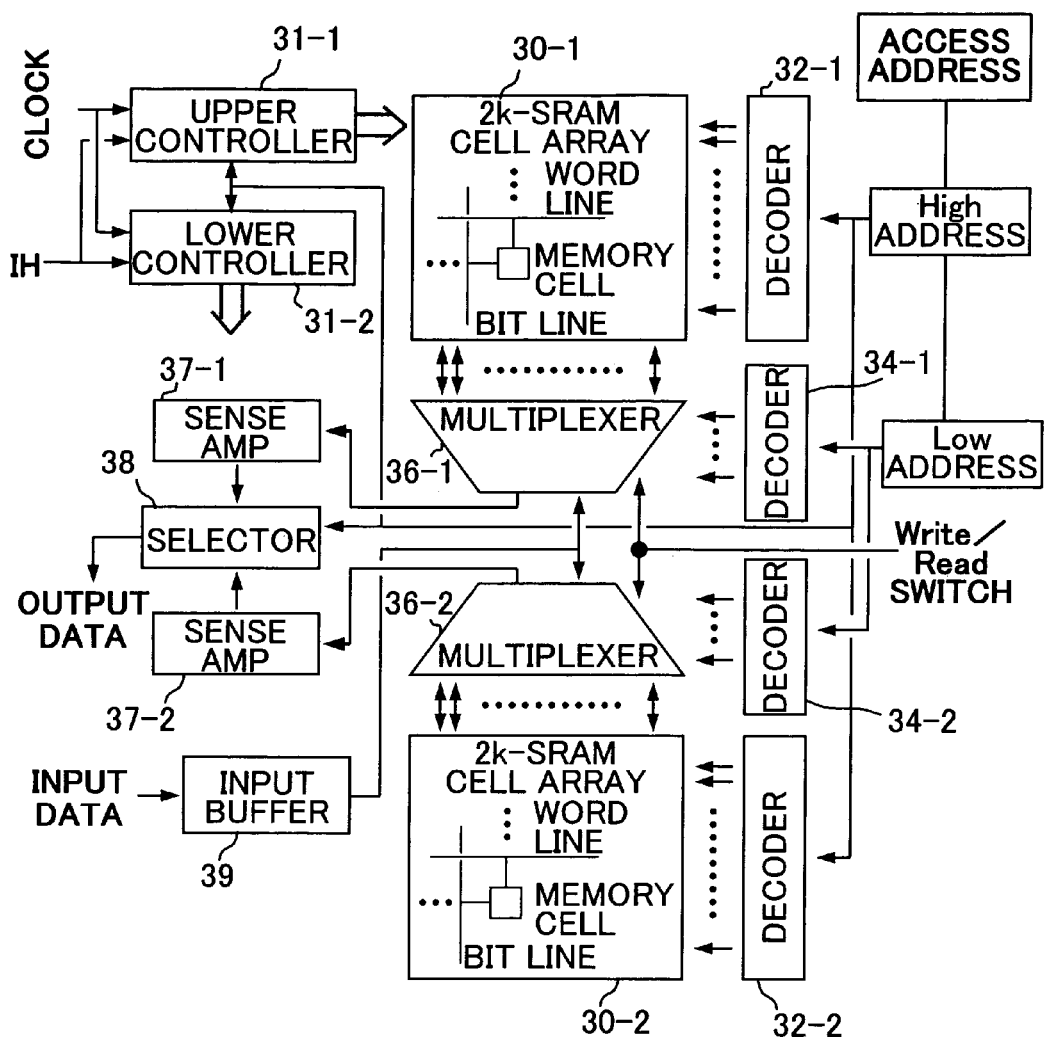
FIG. 12 shows an SRAM configuration diagram as an object circuit of FIG. 11.
Figure 13:
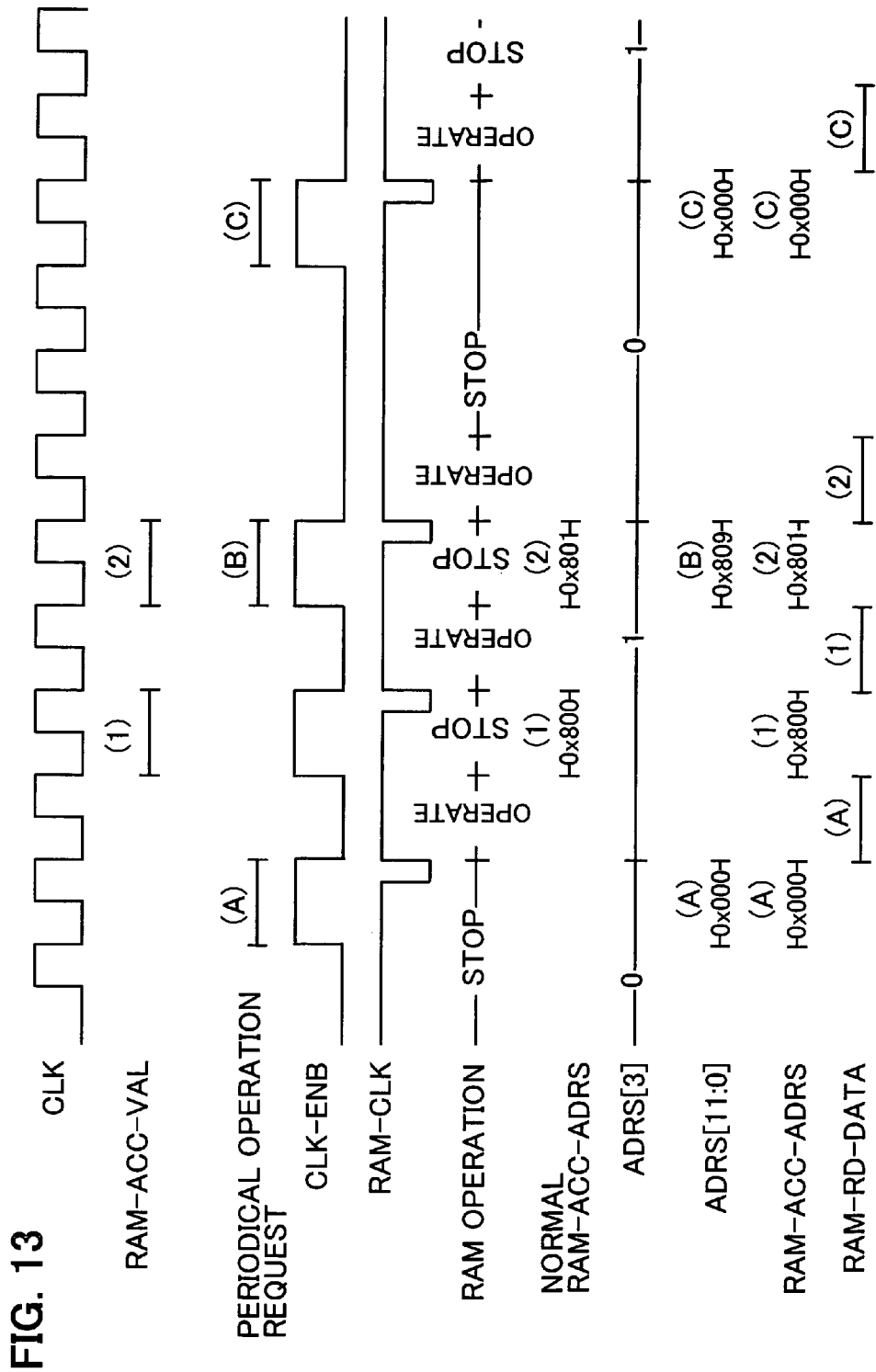
FIG. 13 shows an operational time chart of FIG. 11.
Figure 14:
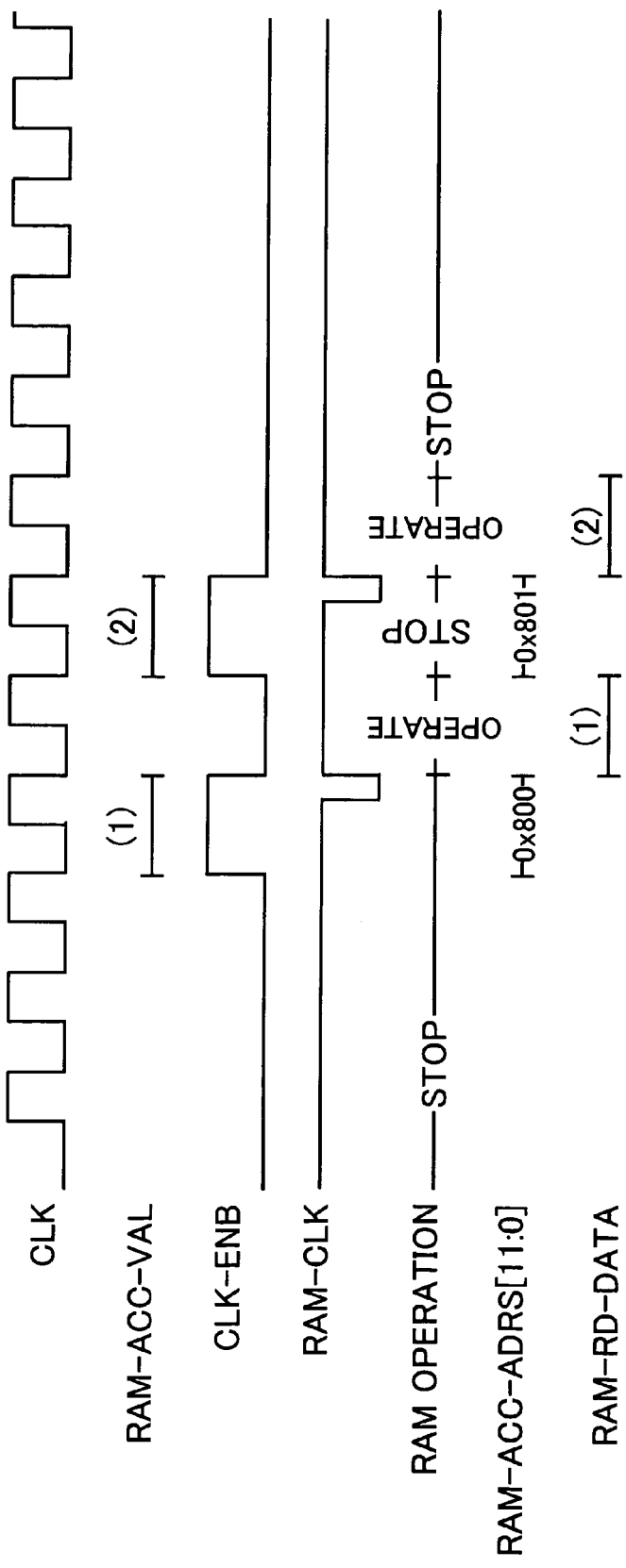
FIG. 14 shows an operational time chart of the conventional configuration as an example for comparison.

Next, a secondary cache memory, to which the second embodiment of the present invention shown in FIG. 5 is applied, will be described. FIG. 9 shows a configuration diagram of a processor according to a third embodiment of the present invention; FIG. 10 shows a configuration diagram of a secondary cache shown in FIG. 9; FIG. 11 shows a detailed partial diagram of FIG. 10; FIG. 12 shows a configuration diagram of a data RAM shown in FIG. 10 and FIG. 11; FIG. 13 shows an operational time chart of FIG. 11 and FIG. 12; and FIG. 14 shows a conventional operational time chart as an example for comparison.

As shown in FIG. 9, a processor is constituted of an LSI chip 1 and a main memory 2, and LSI chip 1 includes instruction control unit and arithmetic unit 3, primary cache 4, and secondary cache 5.

In the instruction control unit 3, in case the data of a requested address does not exist in the primary cache 4, a move-in request (MOVE-IN-REQ) is issued to the secondary cache 5. In case the data exists in the secondary cache 5, the data is read out from a data RAM of the secondary cache 5, and replied to the primary cache 4 as a MOVE-IN-DATA. On receipt of this, the primary cache 4 returns the requested data (DATA-BUS) to the arithmetic unit 3, and the result of the arithmetic operation is stored in the primary cache 4 by DATA-BUS.

FIG. 10 shows a configuration diagram of the secondary cache 5, in which only a control part of the secondary cache for a move-in request is illustrated. Namely, a portion corresponding to the flow of the move-in request (MOVE-IN-REQ) and its response (MOVE-IN-DATA) in the secondary cache 5 is shown.

As shown in FIG. 10, the move-in request (MOVE-IN-REQ) is accepted in an MIPORT 6. MIPORT 6 is constituted of a plurality of ports so as to hold a plurality of MOVE-IN-REQs. A single request is selected in MIPORT 6, and then sent to a priority controller 7. The priority controller 7 selects one request in selector 40, out of a plurality of requests including the requests from other ports, and feeds to a pipeline 8 through a latch circuit 41. At this time, a validity (VAL) of the request and a request address (ADRS) are also sent to a TAG-RAM controller 9-1 and a DATA-RAM controller 9-2.

TAG-RAM controller 9-1 manages the cache, and holds the lower address part of the request address as INDEX-ADRS and the upper address part as TAG. Using the lower address part, a TAG-RAM 42 is searched. In an address match circuit 44, if the upper address part being read out from TAG-RAM 42 and latched in a latch circuit 43 matches the upper part of the request address flowing in pipeline 8, it comes to be known that the requested data is existent in the secondary cache 5.

TAG is 4-way set associative, and it is possible to have 4 TAGs (=the number of ways) for an INDEX-ADRS. Among the 4 ways, the way of address matching (MCH-WAY) is notified to DATA-RAM controller 9-2.

Meanwhile, using the validity (VAL) of the request sent from pipeline 8, DATA-RAM controller 9-2 initiates a DATA-RAM 10 (i.e. sets to a state capable of inputting a clock), and reads out data from DATA-RAM 10, using the lower address part. The readout data for 4 ways are selected in a data selector 50, using the matching signal (MCH-WAY) received from TAG-RAM controller 9-1. Thus, a MOVE-IN-DATA is obtained and this data is sent to the primary cache 4.

The above is an ordinary operation flow. A readout request of DATA-RAM 10 derived from the MOVE-IN-REQ is an operation request in the ordinary system of the present invention. Also, the address requested in the MOVE-IN-REQ is used when reading out from DATA-RAM 10, which is an input pattern in the present invention.

Such DATA-RAM 10 is constituted of a multiplicity of 4KW-SRAMs to realize a large cache capacity. Since the power consumed in DATA-RAM 10 of the secondary cache 5 is large among the power consumption of LSI-CHIP 1, it is controlled so that the clock CLK in not applied to this DATA-RAM 10 when it is not necessary, that is, when no request is input to pipeline 8.

As an embodiment of the present invention, a pulse generator unit 12 and a pattern generator unit 16 are provided in the priority controller 7. Also, an arbiter circuit 15 is provided in DATA-RAM controller 9-2 to avoid an influence to the operation (input address) in the ordinary system, namely, to enable reading out a correct data from DATA-RAM 10 by an original MOVE-IN-REQ.

When a periodic pulse is issued from the pulse generator unit 12 provided in the priority controller 7, a clock is applied to DATA-RAM 10 through an OR gate 14 and a clock chopper 48.

Meanwhile, from the pattern generator unit 16, an effective address for accessing DATA-RAM 10 is output at the time of each periodic pulse, and by means of the arbiter circuit 15, DATA-RAM 10 is accessed only when an ordinary request (MOVE-IN-REQ) is not existent.

Accordingly, from DATA-RAM 10, at the time of periodic operation, a meaningless data is readout. However, because no MOVE-IN-REQ is flowing on the pipeline 8, the readout data is processed as invalid data.

The address output from the pattern generator unit 16 is only RAM-ACC-ADRS[3] which is a bit indicating either stack in 4KW-SRAM 10 shown in FIG. 12. Because 4KW-SRAM 10 is constituted of two 2KW-SRAMs being stacked together, both 2KW-SRAMs are accessed with the address bit RAM-ACC-ADRS[3] being changed as 0->1->0->1 . . . , according to each periodic pulse.

In the address (i.e. 12-bit width of RAM-ACC-ADRS[11:0]) for accessing 4KW-RAM 10, the address being input to the pipeline 8 is appropriated as RAM-ACC-ADRS, except for RAM-ACC-ADRS[3]. However, because a valid request (MOVE-IN-REQ) is not actually to be input to the pipeline 8 at the time of periodic operation of the pulse generator circuit 12, the address is basically all 0's, except for ADRS[3].

For example, after DATA-RAM 10 has not been in operation (clock has not been applied) for a long time, data error continues for no less than 1,000 cycles in the present exemplary case. Considering that the ADRS[3] is varied, it is desirable that a periodic pulse is generated at least once in 500 cycles, and both ADRS[3]=0 and 1 are operated within 1,000 cycles.

Whether the set period produces a real effect cannot be known until LSI-CHIP 1 is manufactured, mounted on a real apparatus, and tested. Since the above logic is to be input as logic before manufacturing the LSI-CHIP, the pulse generator circuit 12 has been constituted of a counter capable of performing one-τ operation in 64 cycles, in consideration of safety.

Next, a low-power consumption controller in the RAM will be described referring to FIG. 11. Here, the second embodiment is used, and like parts having been described in FIG. 5 are referred to by like symbols. The operation control of RAM 10 (i.e. control of the RAM-CLK) is the same as that illustrated in FIG. 5.

This 4KW-RAM 10 is constituted of two 2KW-RAMs being stacked together, and either one of the 2KW-RAMs is operated according to the RAM-ACC-ADRS[3]. Therefore, at the time of the periodic operation, it is necessary to periodically operate both points by inverting the RAM-ACC-ADRS[3]. Accordingly, in the pattern generator unit 16, the ADRS[3] is generated with the configuration shown in FIG. 7, and by appropriating a RAM-ACC-ADRS[11:4, 2:0] in the ordinary system as other address bits, a 12-bit width address ADRS[11:0] is obtained.

As shown in FIG. 13, when the RAM-ACC-VAL of the operation request in the ordinary system is valid, RAM 10 is operated by the RAM-CLK via OR gate 14 and clock chopper 48, and at the same time, the RAM-ACC-ADRS[11:0] of the ordinary system is selected by AND gate 15A in arbiter circuit 15. Thus, the input (RAM-ACC-ADRS[11:0]) for RAM 10 is obtained.

On the other hand, when the RAM-ACC-VAL of the ordinary system is invalid, a synthesis of the ADR[3] obtained from the pattern generator unit 16 with the ADRS[11:4, 2:0] is selected, and the input (RAM-ACC-ADRS[11:0]) for RAM 10 is produced.

In contrast, as shown in FIG. 14, in the case the forcible operation mechanism according to the present invention is not provided, when the RAM-ACC-VAL of the operation request in the ordinary system is valid, RAM 10 is operated by the RAM-CLK via OR gate 14 and clock chopper 48, and at the same time, the RAM-ACC-ADRS[11:0] in the ordinary system is selected by AND gate 15A in the arbiter circuit 15, and thus the input (RAM-ACC-ADRS[11:0]) for RAM 10 is obtained. However, when the RAM-ACC-VAL in the ordinary system is invalid, the operation of RAM 10 is suspended.

Now, referring to FIG. 12, 4KW-RAM 10 having two 2KW-RAMs stacked together will be described. An upper-stage memory control circuit 31-1 controls SRAM cell array 30-1, decoders 32-1, 34-1, multiplexer 36-1, sense amplifier 37-1 and selector 38, using a clock. The upper address in the access address selects a word line of the cell array 30-1, while the lower address in the access address selects a bit line of the cell array 30-1 by means of the multiplexer 36-1.

As to readout, it is selected by the multiplexer 36-1 from the cell array 30-1, and is output through the sense amplifier 37-1 and the selector 38. As to wiring, the input data is written from the input buffer 39 to a memory cell of a bit line being selected by the multiplexer 36-1.

Meanwhile, a lower-stage memory control circuit 31-2 controls SRAM cell array 30-2, decoders 32-2, 34-2, multiplexer 36-2 and sense amplifier 37-2, using the clock. The upper address in the access address selects a word line of the cell array 30-2, while the lower address in the access address selects a bit line of the cell array 30-2 by means of the multiplexer 36-2.

As to readout, it is selected by the multiplexer 36-2 from the cell array 30-2, and is output through the sense amplifier 37-2 and the selector 38. As to wiring, the input data is written from the input buffer 39 to a memory cell of a bit line being selected by the multiplexer 36-2.

In the above example, the 4KW-RAM is realized by stacking the 2KW-RAMs into the upper and lower positions, and the clock and an inhibit signal IH of the clock chopper are respectively input to the upper control circuit and the lower control circuit 31-1, 31-2, independently. The upper-stage control circuit 31-1 controls the cell array 30-1, the decoders 32-1, 34-1, the multiplexer 36-1 and the sense amplifier 37-1 which are provided in the upper stage, and the lower-stage control circuit 31-2 controls those provided in the lower stage.

According to the present embodiment, the feature is that the conventional circuit configuration is not modified in a large scale. It is read operation that is performed by the periodic pulses. In other words, it is configured to perform dummy read operation periodically. The portion of internal circuit being operated is larger in reading than in wiring.

When no operation request arrives caused by the inhibit signal IH of the clock chopper, the internal circuit is not operated at all. When an operation request arrives by the inhibit signal IH, only the circuit in the upper stage or the circuit in the lower stage is operated, depending on the address.

Even when only one side of the circuit is in operation on receipt of the operation request, there may be a case that a portion of the circuits in the decoders or the multiplexer is not operated, depending on the address pattern. Therefore, by varying the input pattern of the address each time the periodic operation is requested, the ratio of the decoders or the multiplexer being in operation can be increased.

According to the present embodiment, only the bit for selecting the upper stage or the lower stage in the access address is varied each time the periodic operation is requested.

The Fourth Embodiment

Figure 15:
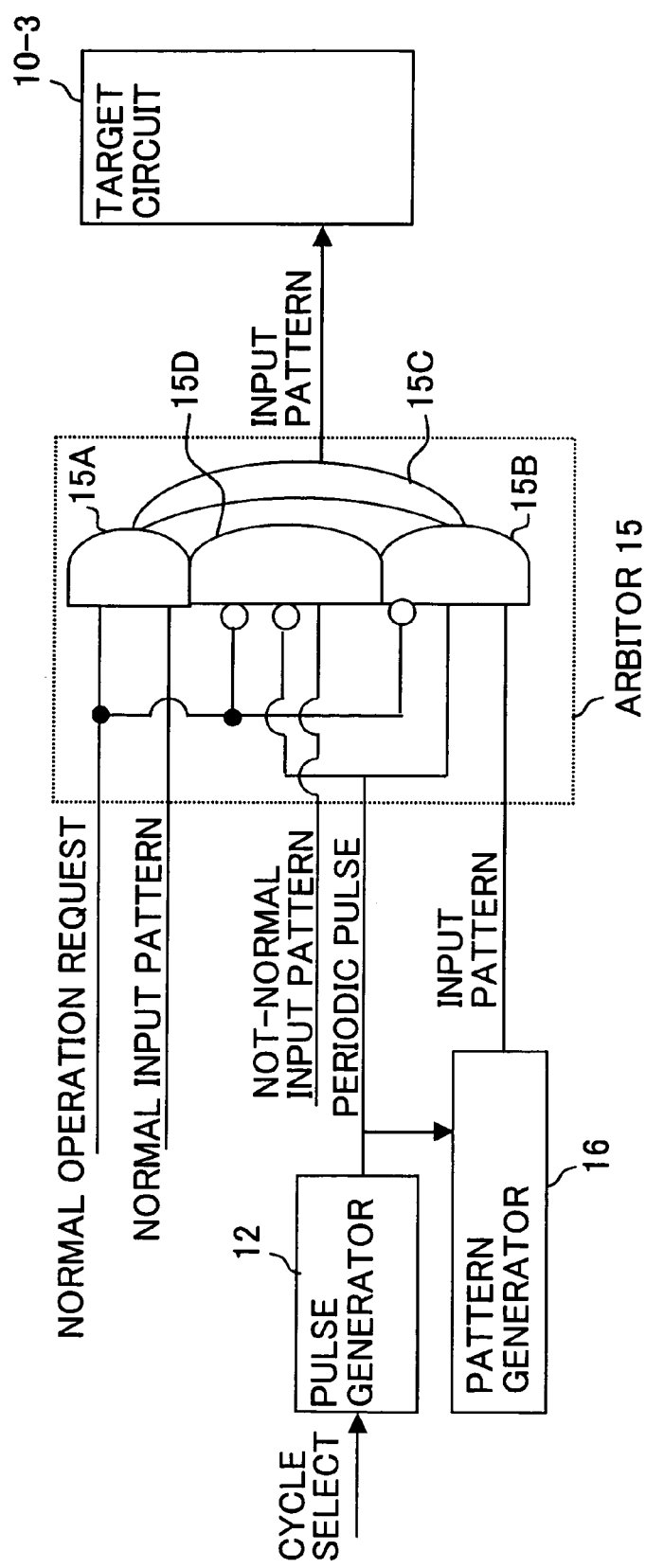
FIG. 15 shows a configuration diagram according to a fourth embodiment of the present invention.
Figure 16:
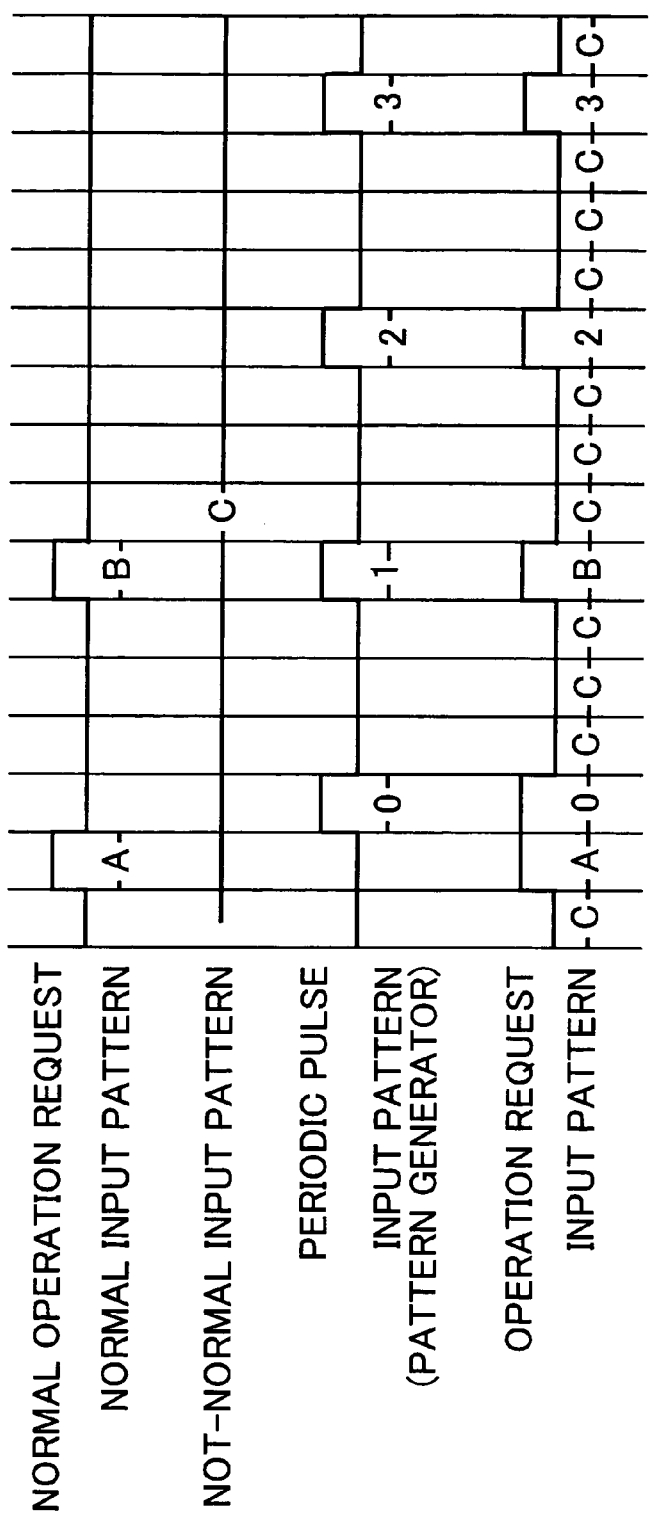
FIG. 16 shows an operational time chart of the configuration shown in FIG. 15.
Figure 17:
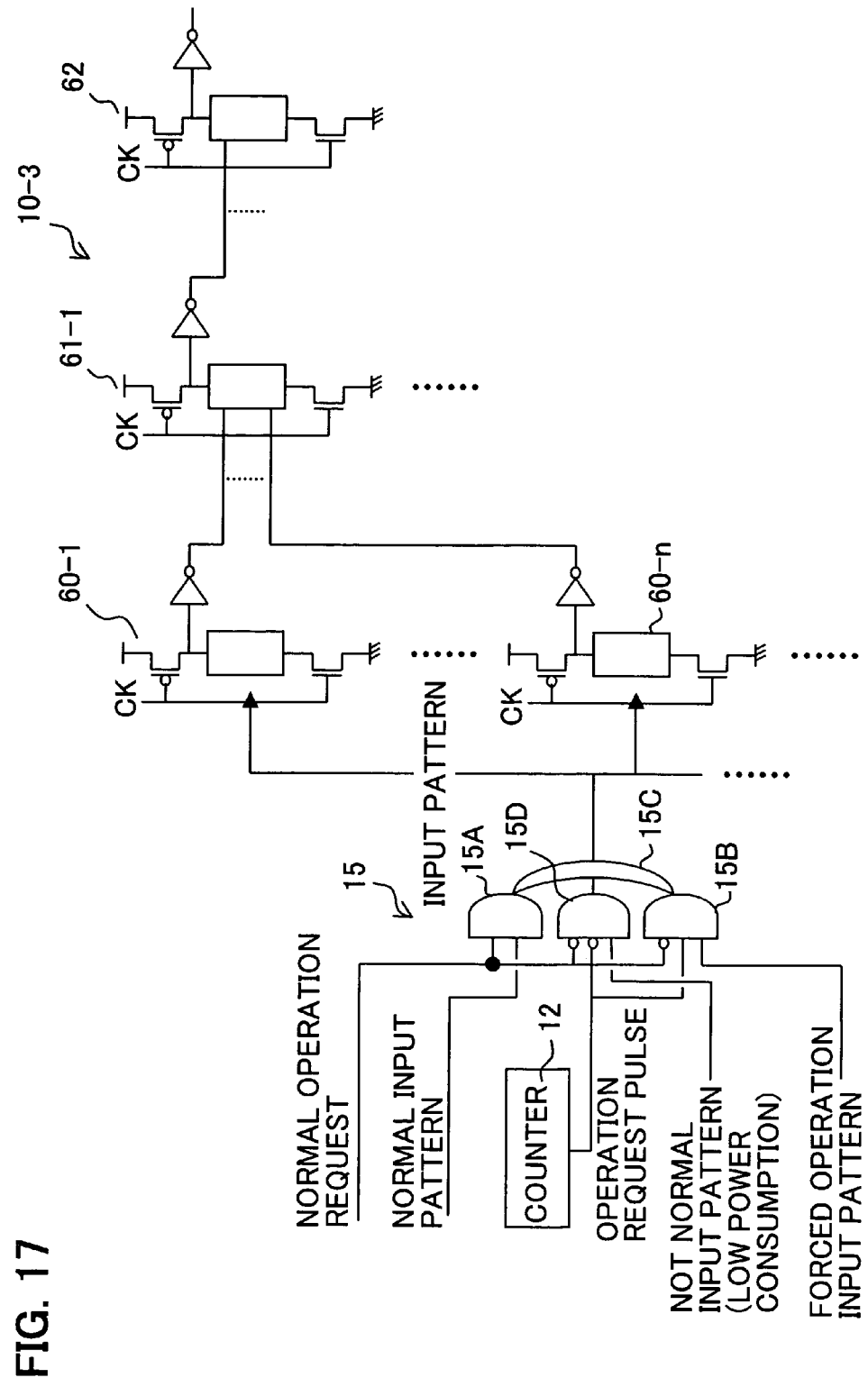
FIG. 17 shows a configuration diagram of a dynamic circuit as an exemplary object circuit of FIG. 1.

FIG. 15 shows a configuration diagram according to a fourth embodiment of the present invention; FIG. 16 shows an operational time chart thereof; and FIG. 17 shows a configuration diagram of a dynamic circuit to which FIG. 15 is applied.

In the example shown in FIG. 15, an object circuit 10-3 is continuously in operation. In this case, by applying a valid pattern at the time the operation is requested in the ordinary system, a valid output is obtained. In this case of the object circuit 10-3, similar to the case of the second embodiment shown in FIG. 5, the operation points vary depending on the input patterns, or the points having unchanged internal states (no switching operation) exist depending on the input patterns.

Further, except for the time the operation is requested in the ordinary system, a special pattern represented by an input pattern in the non-ordinary system is input to the object circuit 10-3, because of not being controlled by an operation request signal. Thus, switching operation in the object circuit 10-3 is refrained to the possible extent, and thereby low power consumption is realized.

In this example also, a pattern generator unit 16 is provided. When generating periodic pulses by a pulse generator unit 12, namely, when requesting operation of the object circuit 10-3, an appropriate pattern can be obtained for use as input pattern to the object circuit. Pattern generator unit 16 generates either fixed or different patterns. Basically, in order that a valid input pattern may be obtained when generating the periodic pulse, the pattern generator unit 16 receives a periodic pulse from the pulse generator unit 12, and generates a next input pattern, using this periodic pulse as trigger.

The input pattern generated by the pattern generator unit 16 is arbitrated by an arbiter circuit 15, so as not to influence the ordinary operation. Namely, as shown in FIG. 16, when the operation request in the ordinary system is valid, an input pattern in the ordinary system is selected by means of an AND gate 15A and an OR gate 15C. On the other hand, when the operation request in the ordinary system is invalid, and when the periodic pulse is generated, an input pattern generated by pattern generator unit 16 is selected by means of an AND gate 15B and OR gate 15C. Further, when neither the operation request in the ordinary system nor the periodic pulse is generated, the input pattern in the non-ordinary system is selected by means of an AND gate 15D and OR gate 15C, which becomes an input to the object circuit 10-3.

This embodiment is effectively applied to a dynamic circuit shown in FIG. 17. Dynamic circuit 10-3 is frequently used as high-speed circuit because of having a speed twice to three times faster than a static CMOS circuit. The dynamic circuit 10-3 operates synchronously with the clock CLOCK, and is precharged at the former half of the clock CLOCK, and then evaluated at the latter half thereof. The dynamic circuit has a defect of large power consumption because it is necessary to precharge each time, thereafter being discharged, even when the output is continued to be LOW (discharged).

A dynamic domino circuit 10-3 shown in FIG. 17 represents a three-stage dynamic circuit. In each dynamic circuit, logic circuits such as AND and OR are disposed between a pair of FETs operated by the clock. Logic operation of the input pattern is performed therein, and the operation result is output to the succeeding stage.

In this dynamic domino circuit 10-3, when the outputs of dynamic circuits 60-1 to 60-n in the first stage are changed, discharge is propagated, like domino toppling, to the dynamic circuits 61-1, 62-1 provided after the first stage. Since the power consumption is large, in order to realize low power consumption, such a measure has been taken that the input patterns to the dynamic circuits 60-1 to 60-n in the first stage are fixed using operation permission/inhibit signals, and at the time of evaluation also, the outputs of the dynamic circuits 60-1 to 60-n in the first stage are kept unchanged, so as to maintain the precharged condition.

As such, when there is no change (discharge) in the output states of the first stage for a long time, the states including the dynamic circuits in the succeeding stages are not changed. Therefore, the aforementioned switching operation is not performed for a long time, which may impede accurate operation in the actual operation.

To cope with this, in addition to dynamic circuit 10-3, a counter 12 is provided, so as to send operation request pulses periodically. The circuit is configured so that periodic permission is issued from the counter 12 to the operation permission/inhibit signals for the dynamic circuit.

Further, when the operation permission is periodically issued to the dynamic circuit 10-3, an input pattern generator unit 16 is additionally provided, from which the input patterns are supplied so as to change the outputs of the dynamic circuits 60-1 to 60-n provided in the first stage.

In such a way, the outputs of the dynamic circuits 60-1 to 60-n in the first stage are changed periodically, and propagated to the succeeding stages, thereby enabling periodic switching operation in a wide range. With this, it becomes possible to eliminate the influence caused by suspended switching operation for a long time.

Further, as a result of the input pattern in the first stage, even when such a characteristic produces unchanged states of suspended operation being continued in dynamic circuits 61-1, 62-1 of the succeeding stages, the input pattern is forcibly supplied to change the outputs of dynamic circuits 60-1 to 60-n in the first stage. By this, dynamic circuits 61-1 to 62-1 disposed after the first stage are put into operation.

Moreover, an arbiter circuit 15 having a configuration shown in FIG. 15 is provided. When a conflict occurs at the time of an operation request in the ordinary dynamic circuit, an operation request to be sent periodically is made invalid, and the input pattern on the ordinary operation request side is input, instead of the input pattern sent from the input pattern generator unit 16. With this, the ordinary operation is not influenced.

Figure 18:
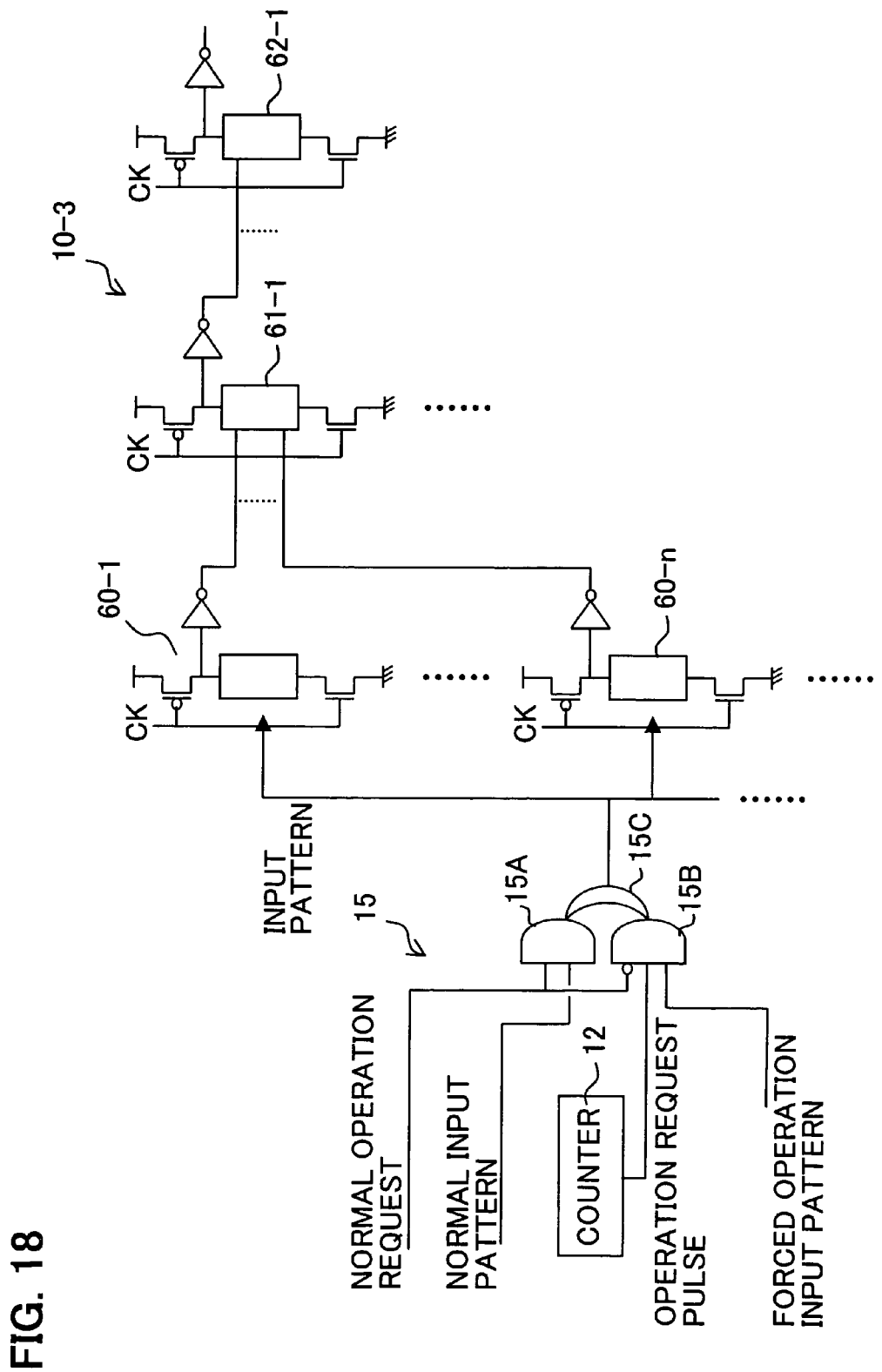
FIG. 18 shows a configuration diagram of a modified embodiment of FIG. 17.
Figure 19:
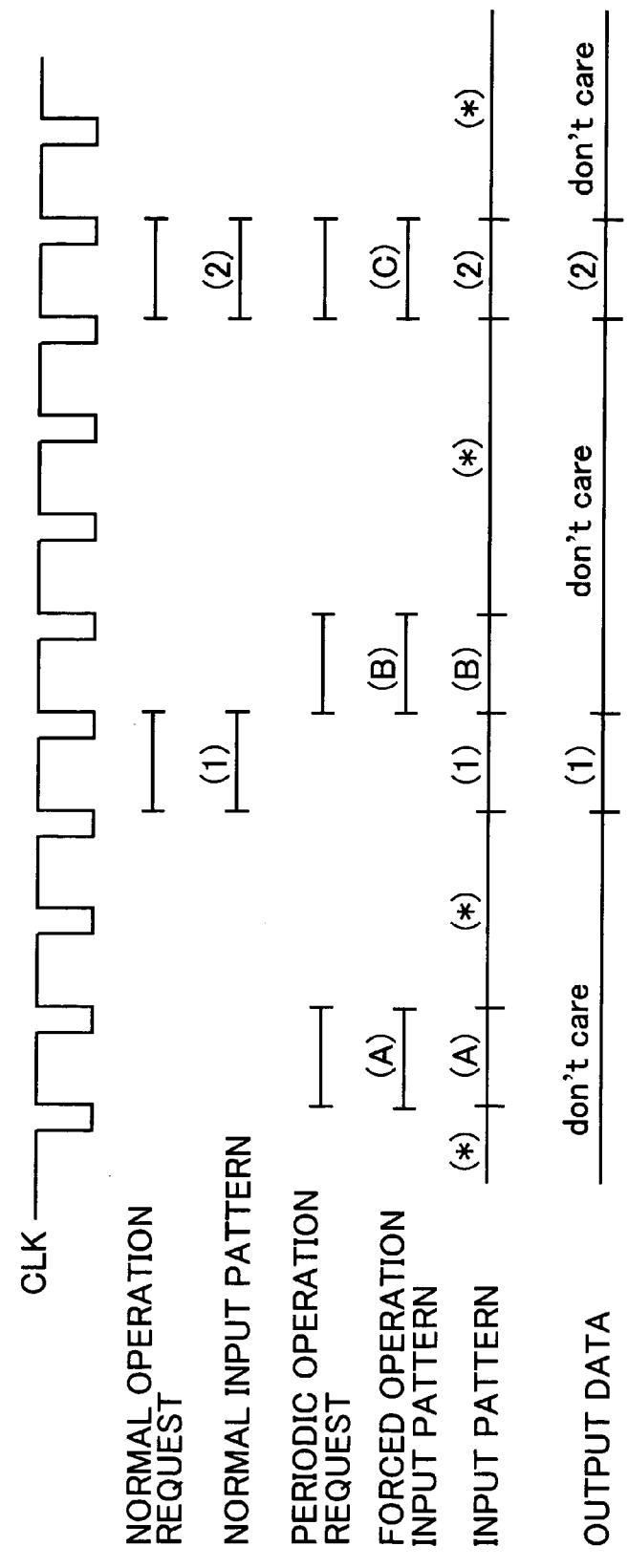
FIG. 19 shows an operational time chart of FIG. 18.

FIG. 18 shows a configuration diagram of an exemplary deformation of the configuration shown in FIG. 17. Also, FIG. 19 shows an operational time chart thereof. In FIG. 18, like parts shown in FIG. 17 are referred to by like symbols. In the configuration shown in FIG. 17, the input pattern of the non-ordinary system may often be a fixed value of all 0's. In such a case, as shown in FIG. 18, AND gate 15D in the arbiter circuit 15 is omitted, and thus the configuration of the arbiter circuit 15 can be simplified. Namely, the arbiter circuit 15 has the same configuration as that shown in FIG. 5.

With such a configuration also, similar to FIG. 17, an input pattern which produces varied outputs of the dynamic circuits 60-1 to 60-n in the first stage is supplied from the input pattern generator unit 16, so that operation permission is issued periodically to the dynamic circuit 10-3, as shown in FIG. 19. In such a way, the outputs of the dynamic circuits 60-1 to 60-n in the first stage are varied periodically, and they are propagated to the succeeding stages. Thus, periodic switching operation in a wide range can be obtained.

The Fifth Embodiment

Figure 20:
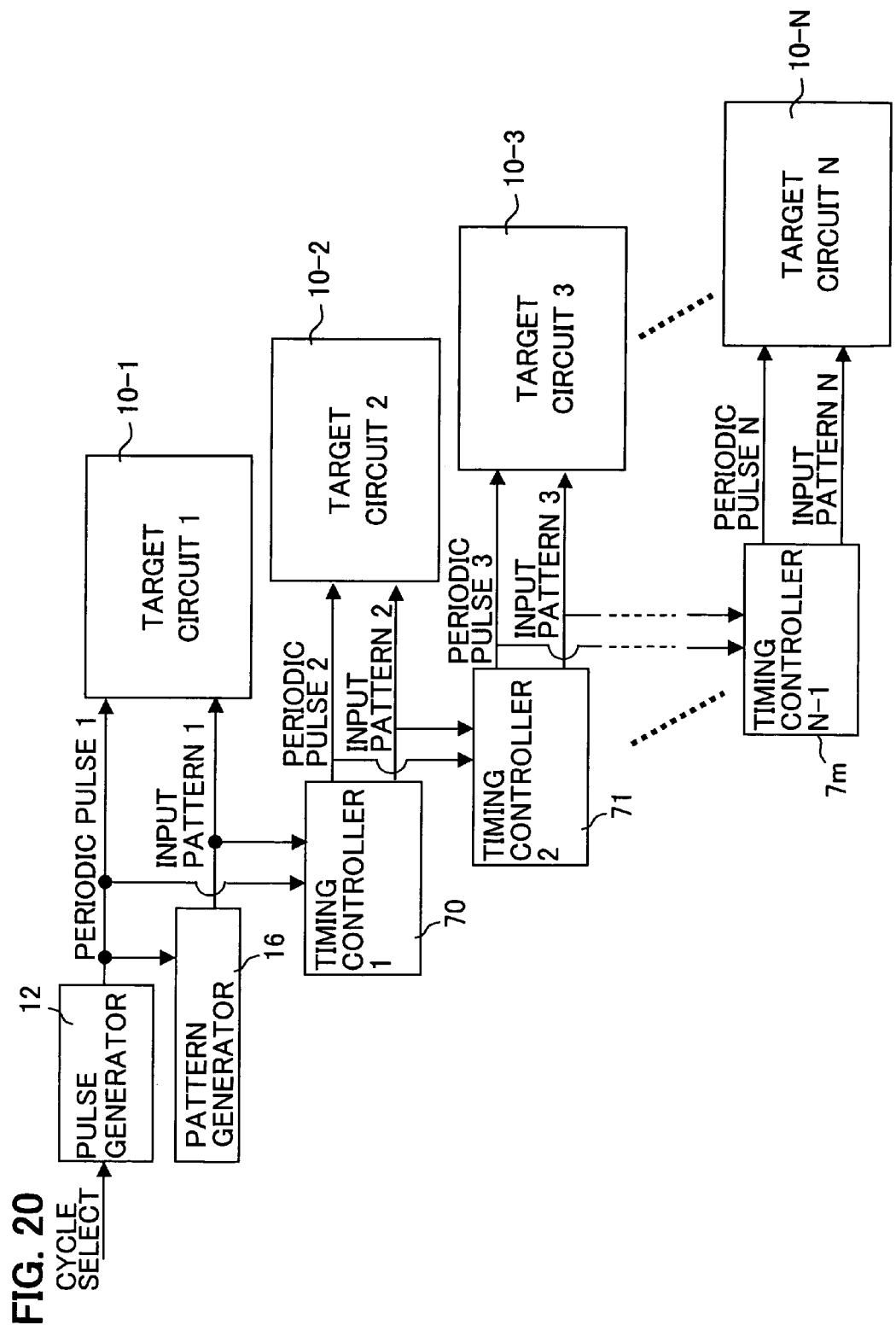
FIG. 20 shows a configuration diagram according to a fifth embodiment of the present invention.
Figure 21:
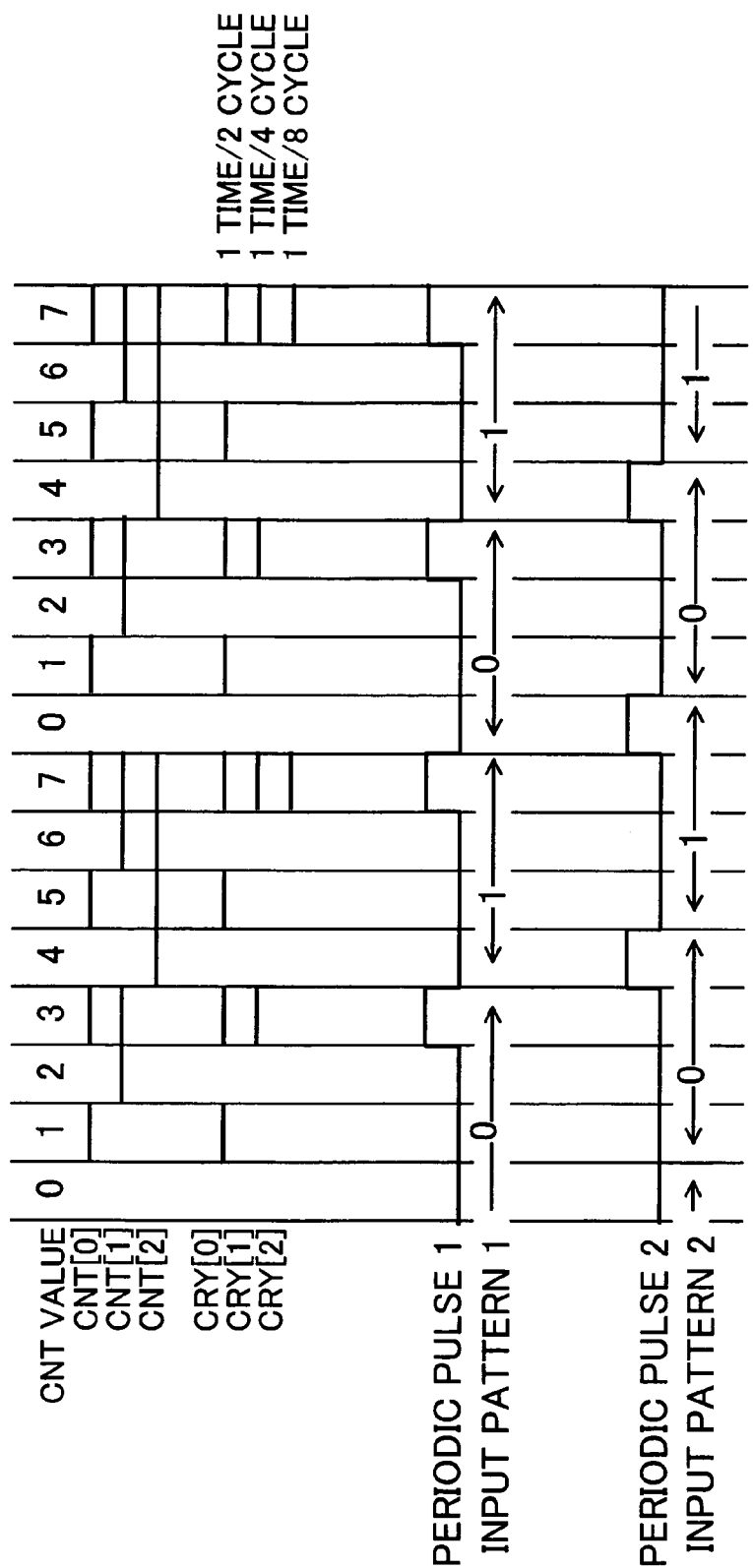
FIG. 21 shows an operational time chart of the configuration shown in FIG. 20.
Figure 22:
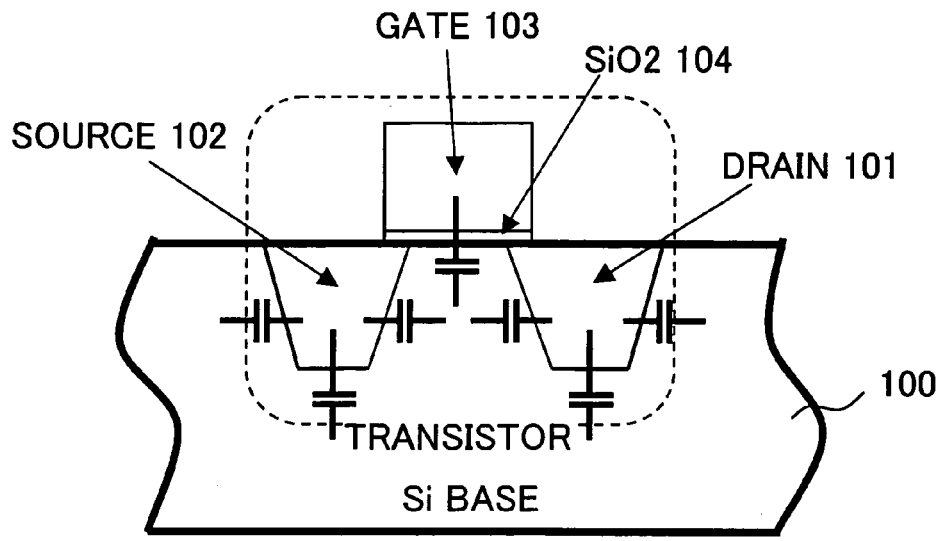
FIG. 22 shows a configuration of a transistor on a bulk substrate.
Figure 23:
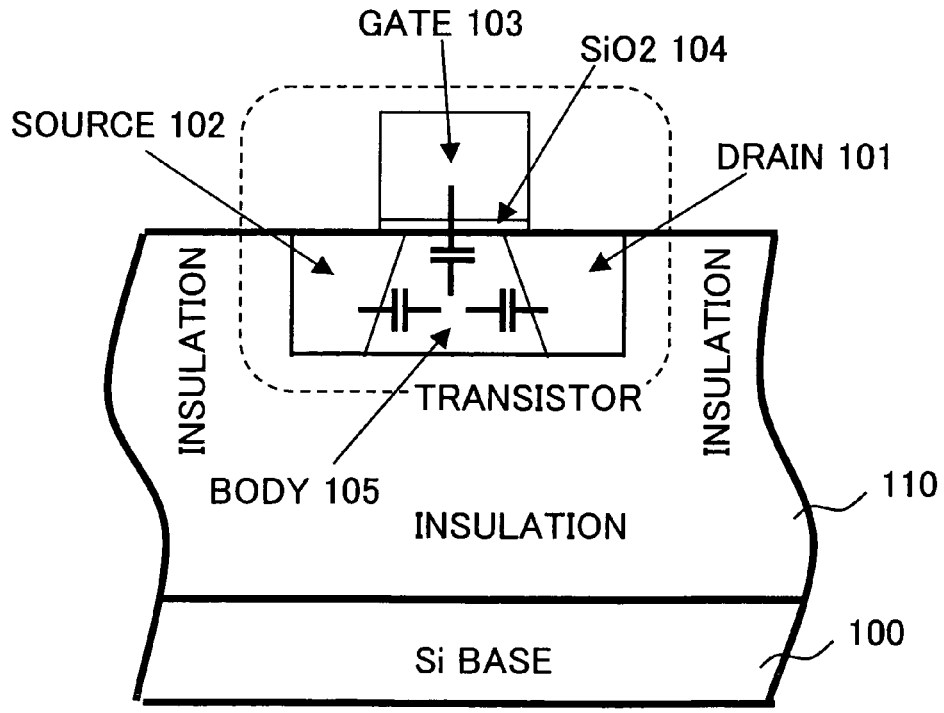
FIG. 23 shows a configuration of a transistor on an SOI substrate.

FIG. 20 shows a configuration diagram according to a fifth embodiment of the present invention, and FIG. 21 shows an operational time chart thereof. When the forcible operation configuration shown in FIG. 5 through FIG. 19 is applied to a plurality of object circuits, it is not desirable from the viewpoint of power consumption if the periodic operation occurs simultaneously throughout the object circuits.

Therefore, as shown in FIG. 20, the timing of a periodic pulse 1 and an input pattern 1 obtained from the pulse generator unit 12 and the pattern generator unit 16 functioning as source to the object circuit 10-1 is shifted by a timing controller 70, which are then used as periodic pulse 2 and input pattern 2 for the next object circuit 10-2. Thereafter, to the rest of object circuits 10-3 to 10-n, the above is applied in a similar manner. Timing controllers 70, 71, ... are constituted of, for example, latch circuits for delayed outputs.

In the time charts shown in FIG. 21, the pulse generator unit 12 is exemplified by a 3-bit counter, which counts from b000 to b111 (CNT[2:0]). At this time, the carry (CRY[2:0]) produced from each bit can be used as periodic pulse. Here, a selected example of once in 4 cycles is shown.

Needless to say, by selecting either one of the carries being output from each bit using a period selection signal, the period of the periodic pulses can be set variably.

Other Embodiments

In the foregoing description of the embodiments, SRAM and a dynamic circuit are exemplified as electronic circuit which is not operated unless an operation signal arrives. However, it is not limited to these circuits. It is also applicable to electronic circuits of other configurations. Also, the pulse generator circuit and the pattern generator circuits are not limited to the above embodiments. Other configurations may be applicable.

INDUSTRIAL APPLICABILITY

As having been described, according to the present invention, by equipping simple circuits for periodically operating an object circuit which is not operated unless an operation signal arrives, it becomes possible to maintain in a stable or balanced state an influence of environmental factors which may affect operation of the circuit element included in the object circuit. Thus, it becomes possible to obtain stable and accurate operation of the object circuit at the time of actual operation.

With this, in order to continuously ensure safety in the current situation that the influence of the peripheral environments to the circuit element is becoming relatively increased to satisfy severer requirements, and that an unexpected situation may possibly occur due to the adoption of new technology, the above-mentioned factors which may influence the operation can be eliminated with the provision of a simple circuit.

What is claimed is:

1. A method for stabilizing n operation of an electronic circuit operating a circuit element group in the electronic circuit by an external operation signal, comprising:
   generating an operation signal forcibly operating the circuit element group periodically from a pulse generator unit; and
   outputting the external operation signal and the periodic operation signal to the circuit element group,
   wherein said outputting comprises outputting the external operation signal or the periodic operation signal, which is a common type signal as said external operation signal, to the circuit element group as an operation signal of the circuit element group.

2. The method for stabilizing the electronic circuit operation according to claim 1, wherein the operation signal is a clock operating the circuit element group.

3. The method for stabilizing the electronic circuit operation according to claim 1, wherein the operation signal is an input pattern for operating the circuit element group.

4. The method for stabilizing the electronic circuit operation according to claim 1, further comprising:
   outputting an input pattern, to forcibly operate the circuit element group, to the circuit element group synchronously with the operation signal.

5. A method for stabilizing n operation of an electronic circuit operating a circuit element group in the electronic circuit by an external operation signal, comprising:
   generating an operation signal to operate the circuit element group periodically from a pulse generator unit;
   outputting an input pattern, to forcibly operate the circuit element group synchronously with the operation signal;
   arbitrating between the external input pattern and the input pattern for the forcible operation, and prioritizing the external input pattern; and
   outputting the external operation signal and the periodic operation signal to the circuit element group.

6. A method for stabilizing n operation of an electronic circuit operating a circuit element group in the electronic circuit by an external operation signal, comprising:
   generating an operation signal for forcibly operating the circuit element group periodically from a pulse generator unit;
   outputting the external operation signal and the periodic operation signal to the circuit element group; and
   shifting the timing of the generated operation signal, and outputting to a circuit element group in another electronic circuit.

7. The method for stabilizing the electronic circuit operation according to claim 1, wherein:
   the circuit element group in the electronic circuit is constituted of an SRAM, and
   the operation signal is a clock for the SRAM.

8. A method for stabilizing n operation of an electronic circuit operating a circuit element group in the electronic circuit by an external operation signal, comprising:
   generating an operation signal for forcibly operating the circuit element group periodically from a pulse generator unit;
   outputting the external operation signal and the periodic operation signal to the circuit element group;
   outputting an input pattern to forcibly operate the circuit element group to the circuit element group synchronously with the operation signal, wherein:
   the circuit element group in the electronic circuit is constituted of an SRAM, and
   the operation signal is a clock for the SRAM, and the input pattern is a memory address of the SRAM.

9. The method for stabilizing the electronic circuit operation according to claim 8, wherein:
   the step of generating the operation signal is executed at the time of reading the SRAM.

10. The method for stabilizing the electronic circuit operation according to claim 3, wherein:

the circuit element group in the electronic circuit is constituted of a dynamic circuit, and the input pattern enables the dynamic circuit to perform a logic operation.

11. An electronic apparatus comprising:
an electronic circuit having a circuit element group operated by an external operation signal;
a pulse generator unit periodically generating an operation signal to forcibly operate the circuit element group when not operated by an external operation signal; and
a logic circuit performing an OR logic selection function on the external operation signal and the periodic operation signal, and outputting the selected signal to the circuit element group,
wherein said logic circuit outputs the external operation signal or the periodic operation signal, which is a common type signal as said external operation signal, to the circuit element group as the operation signal of the circuit element group.

12. The electronic apparatus according to claim 11, wherein the operation signal is a clock for operating the circuit element group.

13. The electronic apparatus according to claim 11, wherein the operation signal is an input pattern for operating the circuit element group.

14. The electronic apparatus according to claim 11, further comprising:
a pattern generator circuit generating an input pattern, synchronously with the operation signal, to forcibly operate the circuit element group.

15. An electronic apparatus comprising:
an electronic circuit having a circuit element group operated by an external operation signal;
a pulse generator unit periodically generating an operation signal to forcibly operate the circuit element group;
a pattern generator circuit generating an input pattern, synchronously with the operation signal, to forcibly operate the circuit element group;
an arbiter circuit arbitrating between the external input pattern and the input pattern for the forcible operation, and prioritizing the external input pattern; and
a logic circuit synthesizing the external operation signal with the periodic operation signal, and outputting the synthesized signal to the circuit element group.

16. The electronic apparatus according to claim 11, further comprising:
a timing adjustment circuit shifting the timing of the generated operation signal, and outputting to a circuit element group in another electronic circuit.

17. The electronic apparatus according to claim 11, wherein:
the circuit element group in the electronic circuit comprises an SRAM, and
the operation signal is a clock for the SRAM.

18. An electronic apparatus comprising:
an electronic circuit having a circuit element group comprising an SRAM operated by an external operation signal;
a pulse generator unit periodically generating an operation signal, the operation signal comprising a clock for the SRAM to forcibly operate the circuit element group;
a pattern generator circuit generating an input pattern, synchronously with the operation signal, to forcibly operate the circuit element group; and
a logic circuit synthesizing the external operation signal with the periodic operation signal, and outputting the synthesized signal to the circuit element group.

19. The electronic apparatus according to claim 18, wherein the pulse generator circuit is operated at the time of reading the SRAM.

20. The electronic apparatus according to claim 13,
wherein the circuit element group in the electronic circuit comprises a dynamic circuit; and
the input pattern enables the dynamic circuit to perform a logic operation.

* * * * *

UNITED STATES PATENT AND TRADEMARK OFFICE
CERTIFICATE OF CORRECTION

| | |
|---|---|
| PATENT NO. | : 7,403,447 B2 |
| APPLICATION NO. | : 11/237659 |
| DATED | : July 22, 2008 |
| INVENTOR(S) | : Hiroyuki Kojima et al. |

It is certified that error appears in the above-identified patent and that said Letters Patent is hereby corrected as shown below:

Column 15, Line 62, change "n" to --an--.

Column 16, Line 19, change "n" to --an--.

Column 16, Line 25, after "group" insert --, to the circuit element group--.

Column 16, Line 31, change "n" to --an--.

Column 16, Line 47, change "n" to --an--.

Column 16, Line 54, after "group;" insert --and--.

Column 17, Line 31, change "apparatus" to --apparatus,--.

Signed and Sealed this

Thirteenth Day of October, 2009

David J. Kappos
*Director of the United States Patent and Trademark Office*